(12) United States Patent
Kumar et al.

(10) Patent No.: US 7,800,934 B2
(45) Date of Patent: Sep. 21, 2010

(54) PROGRAMMING METHODS TO INCREASE WINDOW FOR REVERSE WRITE 3D CELL

(75) Inventors: Tanmay Kumar, Pleasanton, CA (US); S. Brad Herner, San Jose, CA (US); Christopher J. Petti, Mountain View, CA (US)

(73) Assignee: Sandisk 3D LLC, Milpitas, CA (US)

( * ) Notice: Subject to any disclaimer, the term of this patent is extended or adjusted under 35 U.S.C. 154(b) by 0 days.

(21) Appl. No.: 11/819,077

(22) Filed: Jun. 25, 2007

(65) Prior Publication Data

US 2008/0007989 A1  Jan. 10, 2008

Related U.S. Application Data

(63) Continuation-in-part of application No. 11/496,986, filed on Jul. 31, 2006, which is a continuation-in-part of application No. 11/237,167, filed on Sep. 28, 2005.

(51) Int. Cl.
*G11C 11/00* (2006.01)
*G11C 11/36* (2006.01)

(52) U.S. Cl. .................. 365/148; 365/163; 365/175

(58) Field of Classification Search ................ 365/100, 365/148, 158, 171, 173, 230.06, 163, 175; 257/260
See application file for complete search history.

(56) References Cited

U.S. PATENT DOCUMENTS

| | | | |
|---|---|---|---|
| 4,646,266 A | | 2/1987 | Ovshinsky et al. |
| 4,665,428 A | | 5/1987 | Hockley et al. |
| 5,166,760 A | * | 11/1992 | Mori et al. ............ 257/260 |
| 5,432,729 A | | 7/1995 | Carson et al. |
| 5,559,732 A | | 9/1996 | Birge |
| 5,693,556 A | | 12/1997 | Cleeves |
| 5,745,407 A | | 4/1998 | Levy et al. |
| 5,751,012 A | | 5/1998 | Wolstenholme et al. |
| 5,835,396 A | | 11/1998 | Zhang |
| 5,915,167 A | | 6/1999 | Leedy |
| 5,962,911 A | | 10/1999 | Manley |
| 5,991,193 A | | 11/1999 | Gallagher et al. |
| 6,034,882 A | | 3/2000 | Johnson et al. |

(Continued)

FOREIGN PATENT DOCUMENTS

EP  1 450 373  8/2004

(Continued)

OTHER PUBLICATIONS

U.S. Appl. No. 10/095,962, filed Mar. 13, 2002, Herner et al.

(Continued)

*Primary Examiner*—Trong Phan
(74) *Attorney, Agent, or Firm*—The Marbury Law Group PLLC

(57) ABSTRACT

A method of operating a nonvolatile memory cell includes providing the nonvolatile memory cell comprising a diode which is fabricated in a first resistivity, unprogrammed state, and applying a forward bias to the diode having a magnitude greater than a minimum voltage required for programming the diode to switch the diode to a second resistivity, programmed state. The second resistivity state is lower than the first resistivity state.

21 Claims, 13 Drawing Sheets

U.S. PATENT DOCUMENTS

| | | | |
|---|---|---|---|
| 6,111,784 A | 8/2000 | Nishimura et al. | |
| 6,130,835 A * | 10/2000 | Scheuerlein | 365/158 |
| 6,236,587 B1 | 5/2001 | Gudesen et al. | |
| 6,306,718 B1 | 10/2001 | Singh et al. | |
| 6,420,215 B1 | 7/2002 | Knall et al. | |
| 6,483,736 B2 | 11/2002 | Johnson et al. | |
| 6,486,065 B2 | 11/2002 | Vyvoda et al. | |
| 6,525,953 B1 | 2/2003 | Johnson | |
| 6,541,312 B2 | 4/2003 | Vyvoda et al. | |
| 6,567,301 B2 | 5/2003 | Anthony et al. | |
| 6,584,029 B2 | 6/2003 | Tran et al. | |
| 6,677,220 B2 | 1/2004 | Van Brocklin et al. | |
| 6,689,644 B2 | 2/2004 | Johnson | |
| 6,693,823 B2 | 2/2004 | Brown | |
| 6,735,111 B2 | 5/2004 | Nejad | |
| 6,777,773 B2 | 8/2004 | Knall | |
| 6,834,008 B2 * | 12/2004 | Rinerson et al. | 365/158 |
| 6,844,564 B2 * | 1/2005 | Tanaka et al. | 257/3 |
| 6,881,994 B2 | 4/2005 | Lee et al. | |
| 6,916,740 B2 | 7/2005 | Kamins | |
| 6,946,719 B2 | 9/2005 | Petti et al. | |
| 6,950,369 B2 * | 9/2005 | Kunikiyo et al. | 365/158 |
| 6,951,780 B1 | 10/2005 | Herner | |
| 6,952,030 B2 | 10/2005 | Herner et al. | |
| 6,952,043 B2 | 10/2005 | Vyvoda et al. | |
| 6,965,137 B2 | 11/2005 | Kinney et al. | |
| 7,038,248 B2 | 5/2006 | Lee | |
| 7,176,064 B2 | 2/2007 | Herner | |
| 7,218,550 B2 * | 5/2007 | Schwabe et al. | 365/158 |
| 7,224,013 B2 * | 5/2007 | Herner et al. | 257/296 |
| 7,283,403 B2 * | 10/2007 | Johnson | 365/230.06 |
| 7,453,755 B2 | 11/2008 | Cleeves | |
| 7,488,625 B2 | 2/2009 | Knall | |
| 2003/0001230 A1 | 1/2003 | Lowrey | |
| 2004/0016991 A1 | 1/2004 | Herner et al. | |
| 2004/0159867 A1 | 8/2004 | Rinerson | |
| 2004/0160818 A1 | 8/2004 | Rinerson | |
| 2004/0161888 A1 | 8/2004 | Rinerson | |
| 2004/0222467 A1 | 11/2004 | Yamazaki et al. | |
| 2004/0228159 A1 | 11/2004 | Kostylev et al. | |
| 2004/0232509 A1 | 11/2004 | Vyvoda et al. | |
| 2005/0052915 A1 | 3/2005 | Herner et al. | |
| 2005/0063220 A1 | 3/2005 | Johnson | |
| 2005/0098800 A1 | 5/2005 | Herner et al. | |
| 2005/0121742 A1 | 6/2005 | Petti et al. | |
| 2005/0121743 A1 | 6/2005 | Herner | |
| 2005/0158950 A1 | 7/2005 | Scheuerlein et al. | |
| 2006/0250836 A1 | 11/2006 | Herner et al. | |
| 2006/0250837 A1 | 11/2006 | Herner et al. | |
| 2007/0002603 A1 | 1/2007 | Cleeves | |
| 2007/0069276 A1 | 3/2007 | Scheuerlein et al. | |
| 2007/0072360 A1 | 3/2007 | Kumar et al. | |
| 2007/0114509 A1 | 5/2007 | Herner | |
| 2008/0017912 A1 | 1/2008 | Kumar et al. | |

FOREIGN PATENT DOCUMENTS

| | | |
|---|---|---|
| TW | 588352 B | 5/2004 |
| TW | I 225716 B | 12/2004 |
| WO | WO 2004/055827 | 7/2004 |

OTHER PUBLICATIONS

U.S. Appl. No. 10/185,507, filed Jun. 27, 2002, Vyvoda et al.
U.S. Appl. No. 10/440,882, filed May 19, 2003, Vyvoda et al.
U.S. Appl. No. 10/728,436, filed Dec. 5, 2003, Chen.
U.S. Appl. No. 10/728,451, filed Dec. 5, 2003, Cleeves et al.
U.S. Appl. No. 10/815,312, filed Apr. 1, 2004, Chen.
U.S. Appl. No. 10/883,417, filed Jun. 30, 2004, Raghuram et al.
U.S. Appl. No. 10/954,510, filed Sep. 29, 2004, Herner.
U.S. Appl. No. 11/148,530, filed Jun. 8, 2006, Herner et al.
U.S. Appl. No. 11/395,995, filed Mar. 31, 2006, Herner et al.
U.S. Appl. No. 11/444,936, filed May 31, 2006, Radigan et al.
U.S. Appl. No. 11/693,858, filed Mar. 30, 2007, Kumar et al.
International Search Report dated Oct. 8, 2008 received in corresponding International Application No. PCT/US2008/007800.
Office Action dated Nov. 24, 2008 received in corresponding U.S. Appl. No. 11/693,845.
Office Action dated Oct. 29, 2008 received in corresponding U.S. Appl. No. 11/237,167.
Office Action mailed Mar. 19, 2009, received in U.S. Appl. No. 11/496,986.
Office Action mailed Apr. 24, 2009, received in U.S. Appl. No. 11/693,858.
Office Action dated Jul. 31, 2009 received in U.S. Appl. No. 11/496,986.
Office Action dated Apr. 20, 2009 received in U.S. Appl. No. 11/819,595.
Office Action dated Sep. 25, 2009 received in U.S. Appl. No. 11/819,595.
Office Action dated Oct. 28, 2009 received in U.S. Appl. No. 11/819,618.
Taiwan Search Report dated Jan. 4, 2009 received in corresponding Taiwan Application No. 095135852.

* cited by examiner

US 7,800,934 B2

PROGRAMMING METHODS TO INCREASE WINDOW FOR REVERSE WRITE 3D CELL

RELATED APPLICATIONS

This application is a continuation-in-part of U.S. application Ser. No. 11/496,986 filed on Jul. 31, 2006, which is a continuation-in part of U.S. application Ser. No. 11/237,167, filed on Sep. 28, 2005, which are hereby incorporated by reference in their entirety.

BACKGROUND OF THE INVENTION

The invention relates to a nonvolatile memory array.

Nonvolatile memory arrays maintain their data even when power to the device is turned off. In one-time-programmable arrays, each memory cell is formed in an initial unprogrammed state, and can be converted to a programmed state. This change is permanent, and such cells are not erasable. In other types of memories, the memory cells are erasable, and can be rewritten many times.

Cells may also vary in the number of data states each cell can achieve. A data state may be stored by altering some characteristic of the cell which can be detected, such as current flowing through the cell under a given applied voltage or the threshold voltage of a transistor within the cell. A data state is a distinct value of the cell, such as a data '0' or a data '1'.

Some solutions for achieving erasable or multi-state cells are complex. Floating gate and SONOS memory cells, for example, operate by storing charge, where the presence, absence or amount of stored charge changes a transistor threshold voltage. These memory cells are three-terminal devices which are relatively difficult to fabricate and operate at the very small dimensions required for competitiveness in modern integrated circuits.

Other memory cells operate by changing the resistivity of relatively exotic materials, like chalcogenides. Chalcogenides are difficult to work with and can present challenges in most semiconductor production facilities.

SUMMARY OF THE PREFERRED EMBODIMENTS

A first embodiment provides for a method of operating a nonvolatile memory cell, comprising providing the nonvolatile memory cell comprising a diode which is fabricated in a first resistivity, unprogrammed state, and applying a forward bias to the diode having a magnitude greater than a minimum voltage required for programming the diode to switch the diode to a second resistivity, programmed state, wherein the second resistivity state is lower than the first resistivity state.

Another aspect of the invention provides for a method of operating a nonvolatile memory cell, comprising providing the nonvolatile memory cell comprising a diode which is fabricated in a first resistivity, unprogrammed state; and applying a plurality of forward bias pulses to the diode to switch the diode to a second resistivity, programmed state, wherein the second resistivity state is lower than the first resistivity state.

Each of the aspects and embodiments of the invention described herein can be used alone or in combination with one another.

The preferred aspects and embodiments will now be described with reference to the attached drawings.

DETAILED DESCRIPTION OF THE PREFERRED EMBODIMENTS

It has been known that by applying electrical pulses, the resistance of a resistor formed of doped polycrystalline silicon, or polysilicon, can be trimmed, adjusting it between stable resistance states. Such trimmable resistors have been used as elements in integrated circuits.

Figure 1:
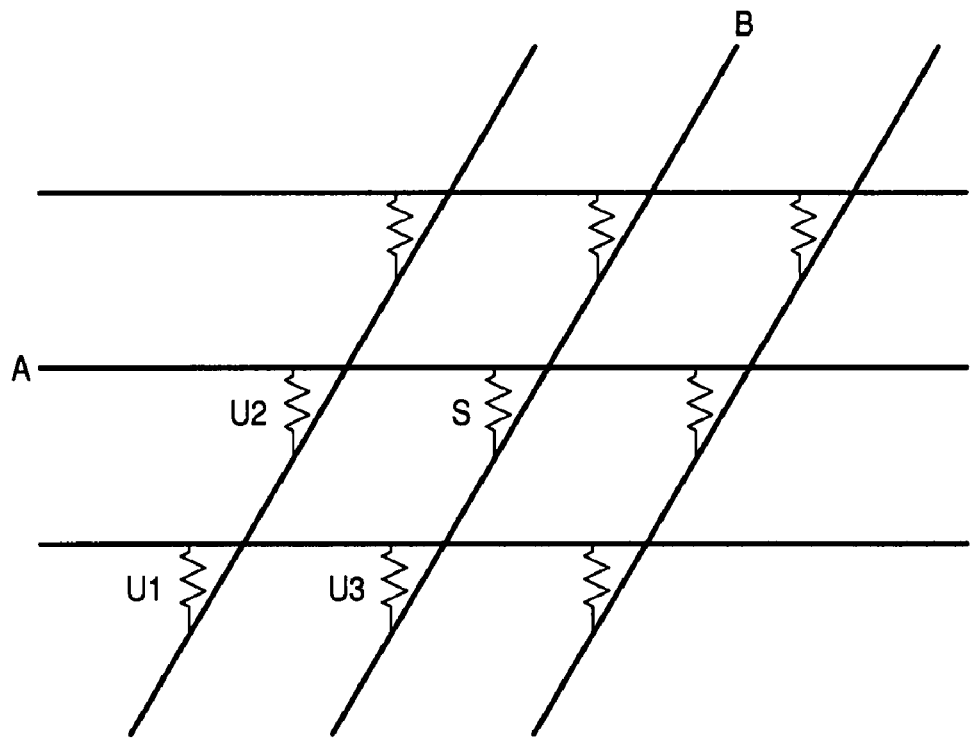
FIG. 1 is a circuit diagram illustrating the need for electrical isolation between memory cells in a memory array.

It is not conventional to use a trimmable polysilicon resistor to store a data state in a nonvolatile memory cell, however. Making a memory array of polysilicon resistors presents difficulties. If resistors are used as memory cells in a large cross-point array, when voltage is applied to a selected cell, there will be undesired leakage through half-selected and unselected cells throughout the array. For example, turning to FIG. 1, suppose a voltage is applied between bitline B and wordline A to set, reset, or sense selected cell S. Current is intended to flow through selected cell S. Some leakage current, however, may flow on alternate paths, for example between bitline B and wordline A through unselected cells U1, U2, and U3. Many such alternate paths may exist.

Leakage current can be greatly reduced by forming each memory cell as a two-terminal device including a diode. A diode has a non-linear I-V characteristic, allowing very little current flow below a turn-on voltage, and substantially higher current flow above the turn-on voltage. In general a diode also acts as one-way valves passing current more easily in one direction than the other. Thus, so long as biasing schemes are selected that assure that only the selected cell is subjected to a forward current above the turn-on voltage, leakage current along unintended paths (such as the U1-U2-U3 sneak path of FIG. 1) can be greatly reduced.

Herner et al., U.S. patent application Ser. No. 10/955,549, "Nonvolatile Memory Cell Without a Dielectric Antifuse Having High- and Low-Impedance States," filed Sep. 29, 2004, hereinafter the '549 application and hereby incorporated by reference, describes a monolithic three dimensional memory array in which the data state of a memory cell is stored in the resistivity state of the polycrystalline semiconductor material of a semiconductor junction diode. This memory cell is a one-time-programmable cell having two data states. The diode is formed in a high-resistivity state; application of a programming voltage permanently transforms the diode to a low-resistivity state. Thus, the antifuse described in the embodiments below is optional and may be omitted.

In embodiments of the present invention, by applying appropriate electrical pulses, a memory element formed of doped semiconductor material, for example the semiconductor diode of the '549 application, can achieve three, four, or more stable resistivity states. In other embodiments of the present invention, semiconductor material can be converted from an initial high-resistivity state to a lower-resistivity state; then, upon application of an appropriate electrical pulse, can be returned to a higher-resistivity state. These embodiments can be employed independently or combined to form a memory cell which can have two or more data states, and can be one-time-programmable or rewriteable.

As noted, including a diode between conductors in the memory cell allows its formation in a highly dense crosspoint memory array. In preferred embodiments of the present invention, then, a polycrystalline, amorphous, or microcrystalline semiconductor memory element either is formed in series with a diode or, more preferably, is formed as the diode itself.

In this discussion, transition from a higher- to a lowerresistivity state will be called a set transition, affected by a set current, a set or programming voltage, or a set or programming pulse; while the reverse transition, from a lower- to a higher-resistivity state, will be called a reset transition, affected by a reset current, a reset voltage, or a reset pulse which places the diode in an unprogrammed state.

In preferred one-time-programmable embodiments, a polycrystalline semiconductor diode is paired with a dielectric rupture antifuse, though in other embodiments the antifuse may be omitted.

Figure 2:
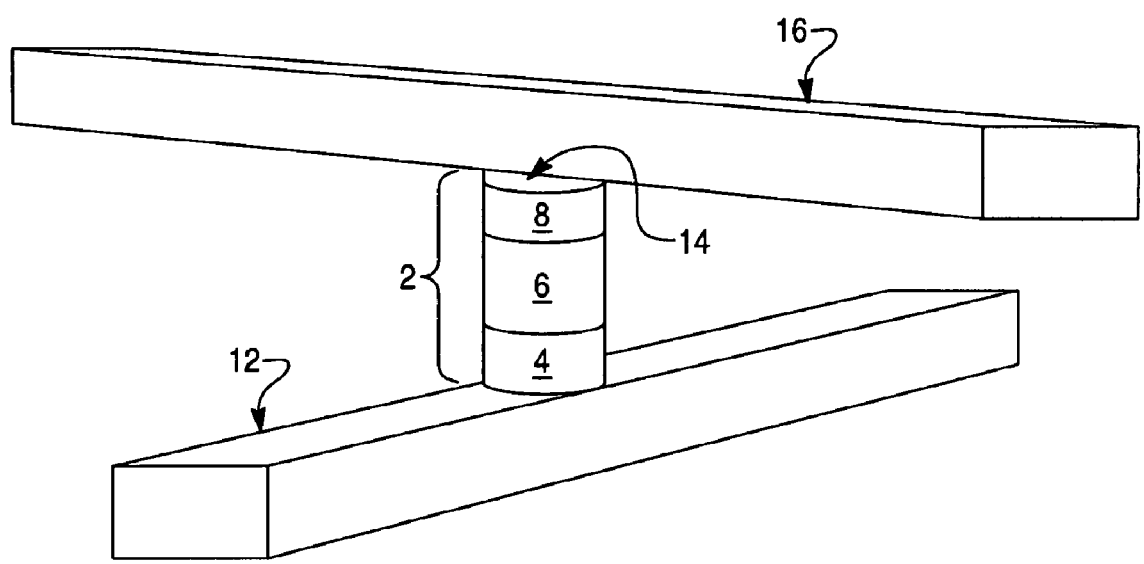
FIG. 2 is a perspective view of a multi-state or rewriteable memory cell formed according to a preferred embodiment of the present invention.
Figure 3:
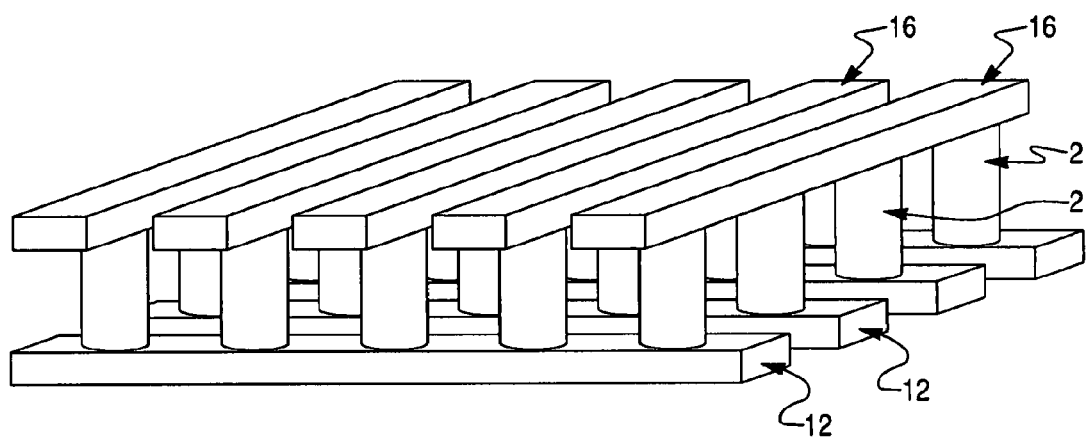
FIG. 3 is a perspective view of a portion of a memory level comprising the memory cells of FIG. 2.

FIG. 2 illustrates a memory cell formed according to a preferred embodiment of the present invention. A bottom conductor 12 is formed of a conductive material, for example tungsten, and extends in a first direction. Barrier and adhesion layers may be included in bottom conductor 12. Polycrystalline semiconductor diode 2 has a bottom heavily doped n-type region 4; an intrinsic region 6, which is not intentionally doped; and a top heavily doped region 8, though the orientation of this diode may be reversed. Such a diode, regardless of its orientation, will be referred to as a p-i-n diode. Dielectric rupture antifuse 14 is included in some embodiments. Top conductor 16 may be formed in the same manner and of the same materials as bottom conductor 12, and extends in a second direction different from the first direction. Polycrystalline semiconductor diode 2 is vertically disposed between bottom conductor 12 and top conductor 16. Polycrystalline semiconductor diode 2 is formed in a high-resistivity state. This memory cell can be formed above a suitable substrate, for example above a monocrystalline silicon wafer. FIG. 3 shows a portion of a memory level of such devices formed in a cross-point array, where diodes 2 are disposed between bottom conductors 12 and top conductors 16 (antifuses 14 are omitted in this view.) Multiple memory levels can be stacked over a substrate to form a highly dense monolithic three dimensional memory array.

In this discussion a region of semiconductor material which is not intentionally doped is described as an intrinsic region. It will be understood by those skilled in the art, however, that an intrinsic region may in fact include a low concentration of p-type or n-type dopants. Dopants may diffuse into the intrinsic region from adjacent regions, or may be present in the deposition chamber during deposition due to contamination from an earlier deposition. It will further be understood that deposited intrinsic semiconductor material (such as silicon) may include defects which cause it to behave as if slightly n-doped. Use of the term "intrinsic" to describe silicon, germanium, a silicon-germanium alloy, or some other semiconductor material is not meant to imply that this region contains no dopants whatsoever, nor that such a region is perfectly electrically neutral.

The resistivity of doped polycrystalline or microcrystalline semiconductor material, for example silicon, can be changed between stable states by applying appropriate electrical pulses. It has been found that in preferred embodiments, set transitions are advantageously performed with the diode under forward bias, while reset transitions are most readily achieved and controlled with the diode under reverse bias. In some instances, however, set transitions may be achieved with the diode under reverse bias, while reset transitions are achieved with the diode under forward bias.

Semiconductor switching behavior is complex. For a diode, both set and reset transitions have been achieved with the diode under forward bias. Generally a reset pulse applied with the diode under forward bias which is sufficient to switch the polycrystalline semiconductor material making up a diode from a given resistivity state to a higher resistivity state will be lower amplitude than a corresponding set pulse (which will switch the same polysilicon semiconductor material from the same resistivity state to a lower resistivity state) and will have a longer pulse width.

Figure 4:
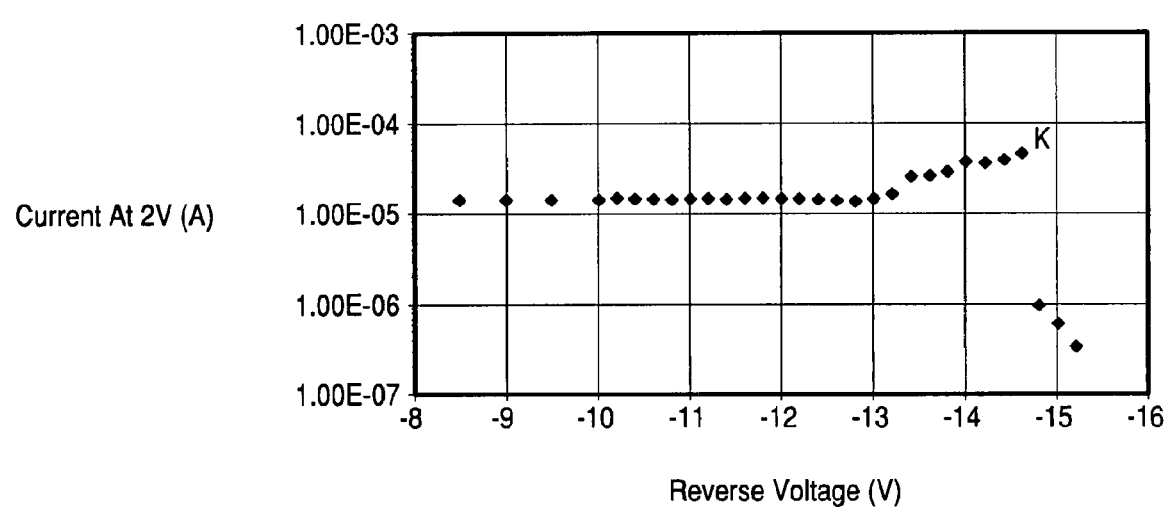
FIG. 4 is a graph, plotted as Current At 2V (A) vs Reverse Voltage (V), showing change in read current for a memory cell of the present invention as voltage in reverse bias across the diode increases.

Switching under reverse bias shows a distinct behavior. Suppose a polysilicon p-i-n diode like the one shown in FIG. 2 is subjected to a relatively large switching pulse under reverse bias. After application of the switching pulse a smaller read pulse, for example 2 volts, is applied, and the current flowing through the diode at the read voltage, called the read current, is measured. As the voltage of the switching pulse under reverse bias is increased in subsequent pulses, the subsequent read current at two volts changes as shown in FIG. 4. It will be seen that initially as the reverse voltage and current of the switching pulse are increased, the read current, when a read voltage is applied after each switching pulse, increases; i.e. the initial transition of the semiconductor material (silicon, in this case) is in the set direction toward lower resistivity. Once the switching pulse reaches a certain reverse bias voltage, at point K in FIG. 4, about −14.6 volts in this example, the read current abruptly begins to drop as reset is achieved and resistivity of the silicon increases. The switching voltage at which the set trend is reversed and the silicon of the diode begins to reset varies, depending on, for example, the resistivity state of the silicon making up the diode when application of the reverse bias switching pulse is begun. It will be seen, then, that by selecting appropriate voltages, either set or reset of the semiconductor material making up the diode can be achieved with the diode under reverse bias.

The diode initially starts in a high read current state (referred to as the programmed state). The diode is put the in the programmed state by a high forward bias voltage pulse, preferably at the factory where the diode is made before the product is sold, where power is not a consideration. Once the product is sold, the diode is subsequently put in the reset state by a reverse bias programming pulse. The difference between the read currents of the programmed and reset states constitutes the "window" for the memory cell. It is desirable for this window to be as large as possible for manufacturing robustness. The present inventors realized that the read current of the programmed diode can be increased by one or both of the following methods.

In one method, a forward bias is applied to the diode having a magnitude greater than a minimum voltage required for programming the diode. For example, if the minimum voltage required to program the diode is 4V, then a programming forward bias of 5 or more volts, such as about 8V to about 12V, for example 10V, is applied to the diode. The forward bias switches the diode from a relatively high resistivity, unprogrammed state to a relatively low resistivity, programmed state. If desired, the maximum voltage which can be applied without damaging the diode may be used as the programming voltage. Since the diode is programmed at the factory before sale of the product, power and programming time are not considerations.

In another method, more than one programming pulse is used. In other words, a plurality of forward bias pulses are applied to the diode to switch the diode from the high resistivity, unprogrammed state to the low resistivity, programmed state. Again, since the diode is programmed at the factory before sale of the product, power and programming time are not considerations. If desired, both methods may be used together, and the diode may be programmed using a plurality of forward bias programming pulses having a magnitude greater than the minimum voltage required for programming.

Distinct data states of the memory cell of the present invention correspond to resistivity states of polycrystalline or microcrystalline semiconductor material making up the diode, which are distinguished by detecting current flow through the memory cell (between top conductor 16 and bottom conductor 12) when a read voltage is applied. Preferably the current flowing between any one distinct data state and any different distinct data state is at least a factor of two, to allow the difference between the states to be readily detectable.

The memory cell can be used as a one-time programmable cell or a rewriteable memory cell, and may have two, three, four, or more distinct data states. The cell can be converted from any of its data states to any other of its data states in any order, and under either forward or reverse bias.

Several examples of preferred embodiments will be provided. It will be understood, however, that these examples are not intended to be limiting. It will be apparent to those skilled in the art that other methods of programming a two-terminal device comprising a diode and polycrystalline or microcrystalline semiconductor material will fall within the scope of the invention.

One-Time Programmable Multilevel Cell

In a preferred embodiment of the present invention, a diode formed of polycrystalline semiconductor material and a dielectric rupture antifuse are arranged in series disposed between a top and bottom conductor. The two-terminal device is used as a one-time-programmable multilevel cell, in preferred embodiments having three or four distinct data states.

A preferred memory cell is shown in FIG. 2. Diode 2 is preferably formed of a polycrystalline or microcrystalline semiconductor material, for example silicon, germanium, or an alloy of silicon and/or germanium. Diode 2 is most preferably polysilicon. In this example, bottom heavily doped region 4 is n-type and top heavily doped region 8 is p-type, though the polarity of the diode may be reversed. The memory cell comprises a portion of the top conductor, a portion of the bottom conductor, and a diode, the diode disposed between the conductors.

Figure 5:
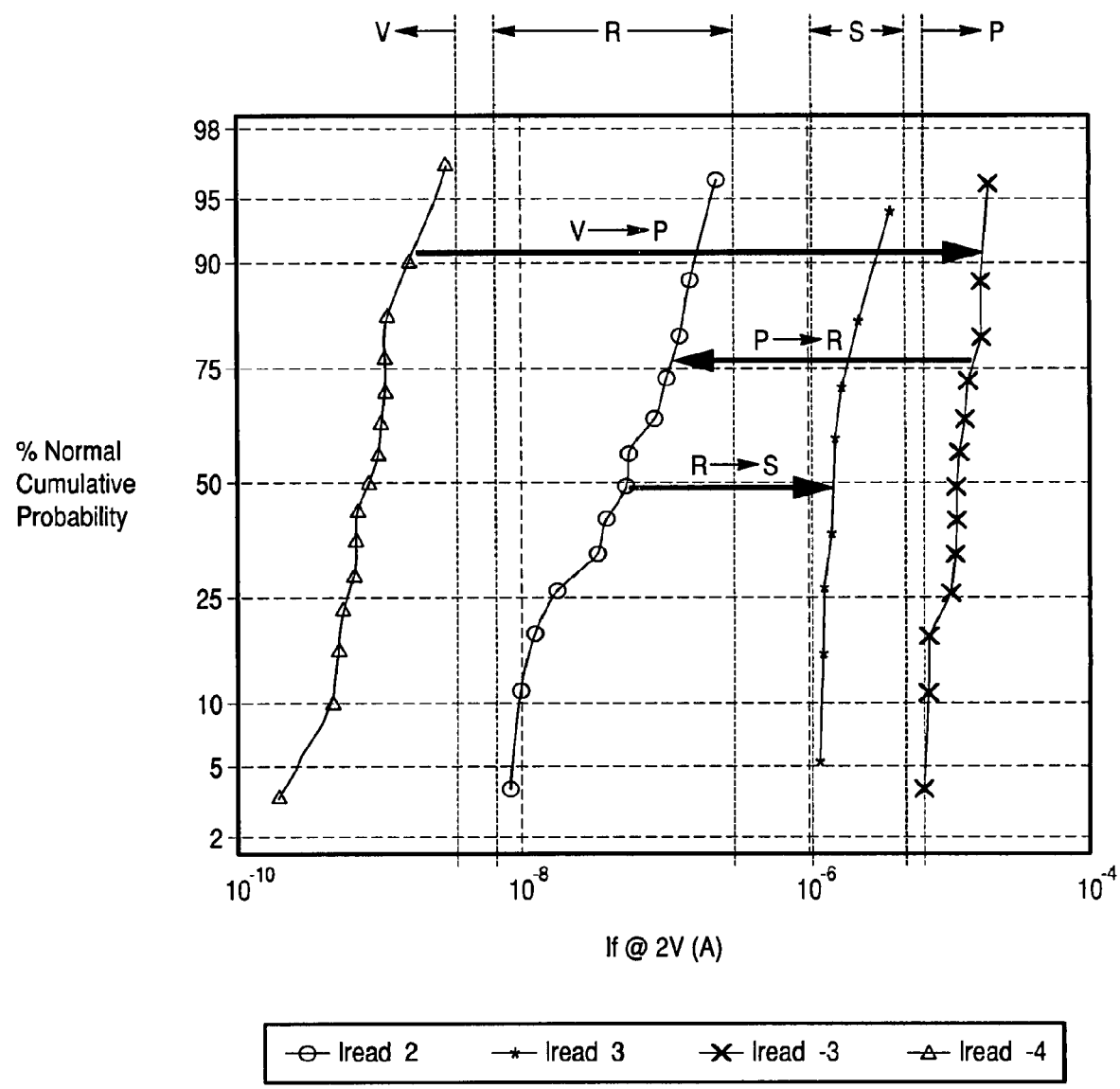
FIG. 5 is a probability plot which is plotted as Percent (%) Normal Cumulative Probability vs. Current Flow under 2V read voltage ($I_f@2V$ (A)) shown for various read current values $I_{read}$ 2, $I_{read}$ 3, $I_{read}$ –3, and $I_{read}$ –4 corresponding to the resistivity states R, S, P, and V, respectively and showing memory cells transformed from the V state to the P state, from the P state to the R state, and from the R state to the S state.

As formed, the polysilicon of diode 2 is in a high-resistivity state, and dielectric rupture antifuse 14 is intact. FIG. 5 is a probability plot showing current of a memory cells in various states. Turning to FIG. 5, when a read voltage, for example 2 volts, is applied between top conductor 16 and bottom conductor 12 (with diode 2 under forward bias) the read current flowing between top conductor 16 and bottom conductor 12 is preferably in the range of nanoamps, for example less than about 5 nanoamps. Area V on the graph of FIG. 5 corresponds to a first data state of the memory cell. For some memory cells in the array, this cell will not be subjected to set or reset pulses, and this state will be read as a data state of the memory cell. This first data state will be referred to as the V state.

A first electrical pulse, preferably with diode 2 under forward bias, is applied between top conductor 16 and bottom conductor 12. This pulse has a magnitude greater than a minimum voltage required for programming the diode. For example, if the minimum voltage required to program the diode is 4V, then a programming forward bias of 5 or more volts, such as between about 8 volts and about 12 volts, for example about 10 volts. The current is, for example, between about 80 and about 200 microamps. The pulse width is preferably between about 100 and about 500 nsec. This first electrical pulse ruptures dielectric rupture antifuse 14 and switches the semiconductor material of diode 2 from a first resistivity state to a second resistivity state, the second state lower resistivity than the first. This second data state will be referred to as the P state, and this transition is labeled "V→P" in FIG. 5. The current flowing between top conductor 16 and bottom conductor 12 at a read voltage of 2 volts is about 10 microamps or more. The resistivity of the semiconductor material making up diode 2 is reduced by a factor of about 1000 to about 2000. In other embodiments the change in resistivity will be less, but between any data state and any other data state will be at least a factor of two, preferably at least a factor of three or five, and more typically a factor of 100 or more. Some memory cells in the array will be read at this data state, and will not be subjected to additional set or reset pulses. This second data state will be referred to as the P state.

For example, the read current at 2V can increase from $1\times10^{-8}$ A in the unprogrammed state to at least $1\times10^{-5}$ A after the programming pulse. The table below shows that increasing the programming voltage results in a higher read current. The last column in the table shows the standard deviation of the read current.

| Programming Pulse Voltage | Programmed Read Current @ +2 V | 1σ |
|---|---|---|
| +6.4 V | $1.1 \times 10^{-5}$ A | $6.1 \times 10^{-6}$ A |
| +7.4 V | $1.7 \times 10^{-5}$ A | $7.2 \times 10^{-6}$ A |
| +8.4 V | $1.8 \times 10^{-5}$ A | $5.4 \times 10^{-6}$ A |

It should be noted that the read currents shown in the table above are for a cell shown in FIG. 2 with the interconnects. If the interconnects are excluded, then the read current is even higher. For a programming voltage of 8.4V, the read current of the cell without the interconnects is at least $3.5\times10^{-5}$ A at a read voltage of at least +1.5V, such as +1.5 to +2V. It is expected that further increases in programming voltage would provide a further increase in the read current. For example, increasing the programming voltage from 8.4V to 10V is expected to generate an about 70% increase in read current, such that the read current for a cell without the interconnects is about $6\times10^{-5}$ A at 2V read voltage. As noted above, multiple programming pulses, such as 2 to 10 pulses, for example 3-5 pulses, may be applied to the diode.

A second electrical pulse, preferably with diode 2 under reverse bias, is applied between top conductor 16 and bottom conductor 12. This pulse is, for example, between about −8 volts and about −14 volts, preferably about between about −10 and about −12 volts, preferably about −11 volts. The current is, for example, between about 80 and about 200 microamps. The pulse width is, for example, between about 100 nanosec and about 10 microseconds; preferably between about 100 nsec and about 1 microsecond, most preferably between about 200 and about 800 nsec. This second electrical pulse switches the semiconductor material of diode 2 from the second (programmed) resistivity state to a third (unprogrammed) resistivity state, the third resistivity state higher resistivity than the second. The current flowing between top conductor 16 and bottom conductor 12 at a read voltage of 2 volts is between about 10 and about 500 nanoamps, preferably between about 100 and about 500 nanoamps. Some memory cells in the array will be read at this data state, and will not be subjected to additional set or reset pulses. This third data state will be referred to as the R state, and this transition is labeled "P→R" in FIG. 5.

To achieve the fourth data state, a third electrical pulse, preferably with diode 2 under forward bias, is applied between top conductor 16 and bottom conductor 12. This pulse is, for example, between about 8 volts and about 12 volts, for example about 10 volts, with current between about 5 and about 20 microamps. This third electrical pulse switches the semiconductor material of diode 2 from the third (unprogrammed) resistivity state to a fourth (programmed) resistivity state, the fourth resistivity state lower resistivity than the third, and preferably higher resistivity than the second resistivity state. The current flowing between top conductor 16 and bottom conductor 12 at a read voltage of 2 volts is between about 1.5 and about 4.5 microamps. Some memory cells in the array will be read at this data state, which will be referred to as the S state, and this transition is labeled "R→S" in FIG. 5.

Figure 17:
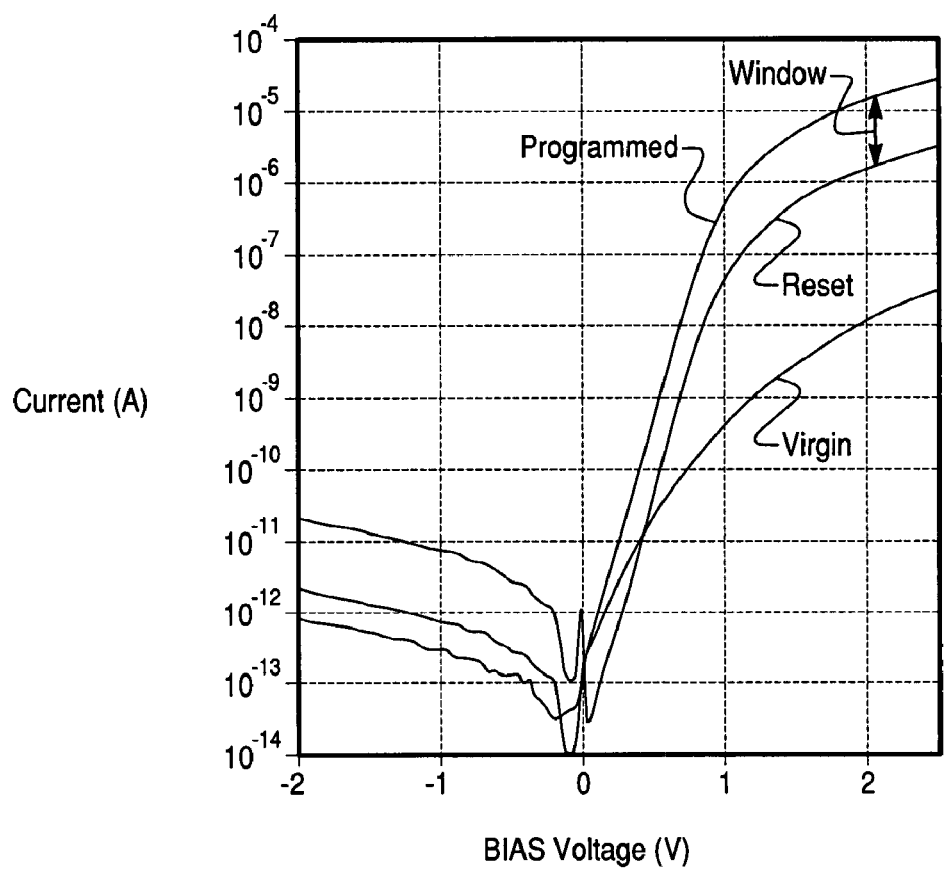
FIG. 17 is a plot of the current flowing through the diode versus the applied voltage for various diode states illustrated in FIG. 5.
Figure 18:
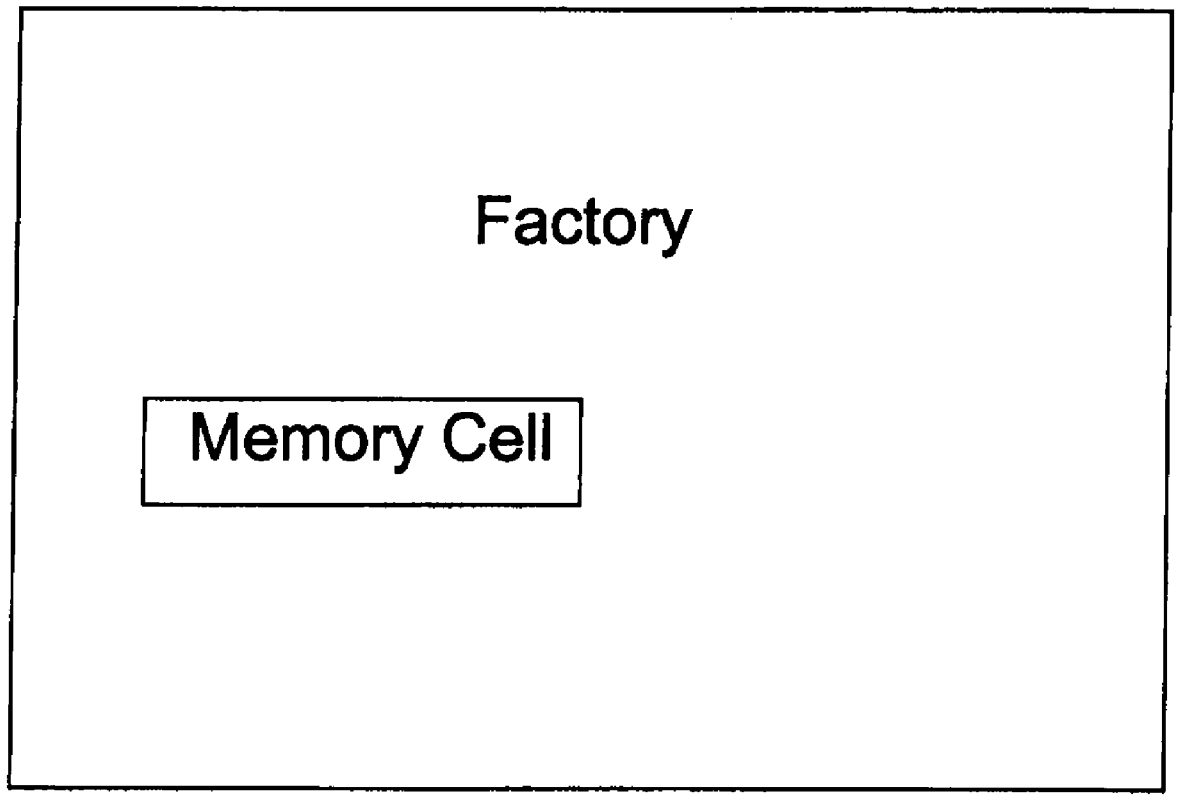
FIG. 18 illustrates the programming of a memory cell at the factory where the cell is produced.

FIG. 17 is a plot of read current versus read voltage for various diode states illustrated in FIG. 5. The diode initially starts in a low read current state V (referred to as the unprogrammed or "virgin" state). The diode is put the in the programmed state P by the high forward bias pulse, preferably at the factory where the diode is made before the product is sold, where power is not a consideration. Once the product is sold, the diode is subsequently put in the reset state R by a reverse bias programming pulse. The difference between the read currents of the programmed and reset states P and R constitutes the "window" for the memory cell, as shown in FIG. 17. The large programming voltage and/or multiple programming pulses allow this window to be as large as possible for manufacturing robustness.

The difference in current at the read voltage (for example 2 volts) is preferably at least a factor of two between any two adjacent data states. For example, the read current of any cell in data state R is preferably at least two times that of any cell in data state V, the read current of any cell in data state S is preferably at least two times that of any cell in data state R, and the read current of a cell in data state P is preferably at least two times that of any cell in data state S. For example, the read current at data state R may be two times the read current at data state V, the read current at data state S may be two times the read current at data state R, and the read current at data state P may be two times the read current at data state S. If the ranges are defined to be smaller, the difference could be considerably larger; for example, if the highest-current V state cell can have a read current of 5 nanoamps and the lowest-current R state call can have a read current of 100 nanoamps, the difference in current is at least a factor of 20. By selecting other limits, it can be assured that the difference in read current between adjacent memory states will be at least a factor of three.

As will be described later, an iterative read-verify-write process may be applied to assure that a memory cell is in one of the defined data states after a set or reset pulse, and not between them.

So far the difference between the highest current in one data state and the lowest current in the next highest adjacent data state has been discussed. The difference in read current in most cells in adjacent data states will be larger still; for example a memory cell in the V state may have a read current of 1 nanoamp, a cell in the R state may have a read current of 100 nanoamps, a cell in the S state may have a read current of 2 microamps (2000 nanoamps), and a cell in the P state may have a read current of 20 microamps. These currents in each adjacent state differ by a factor of ten or more.

A memory cell having four distinct data states has been described. To aid in distinguishing between the data states, it may be preferred for three rather than four data states to be selected. Four example, a three-state memory cell can be formed in data state V, set to data state P, then reset to data state R. This cell will have no fourth data state S. In this case the difference between adjacent data states, for example between the R and P data states, can be significantly larger.

A one-time programmable memory array of memory cells as described, each cell programmed to one of three distinct data states (in one embodiment) or one of four distinct data states (in an alternative embodiment), can be programmed as described. These are only examples; clearly there could be more than three or four distinct resistivity states and corresponding data states.

Figure 6:
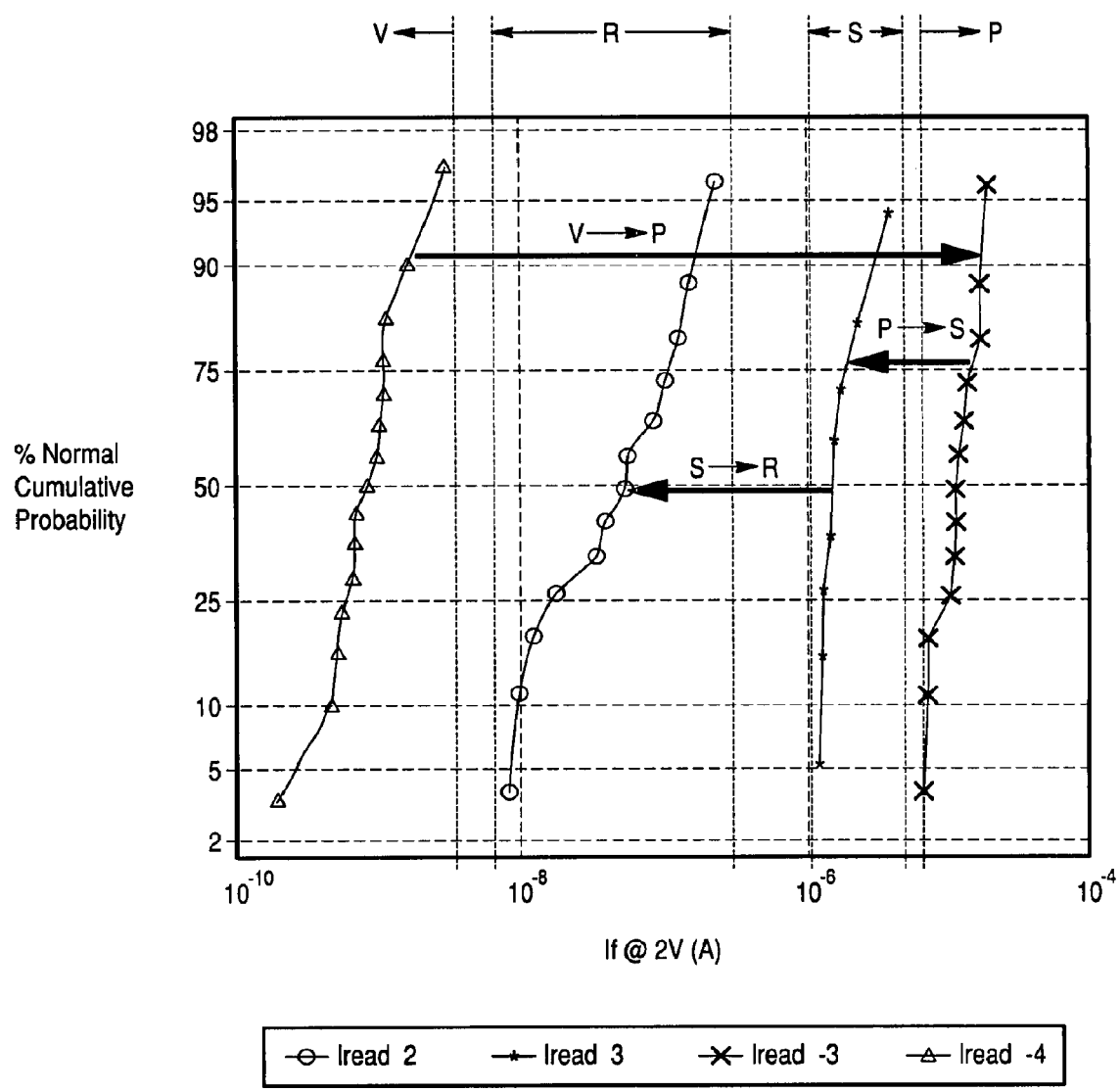
FIG. 6 is a probability plot which is plotted as Percent (%) Normal Cumulative Probability vs. Current Flow under 2V read voltage ($I_f@2V$ (A)) shown for various read current values $I_{read}$ 2, $I_{read}$ 3, $I_{read}$ –3, and $I_{read}$ –4 corresponding to the resistivity states R, S, P, and V, respectively and showing memory cells transformed from the V state to the P state, from the P state to the S state, and from the S state to the R state.

In a memory array of one-time programmable memory cells, the cells may be programmed in a variety of ways, however. For example, turning to FIG. 6, the memory cell of FIG. 2 may be formed in a first state, the V state. A first electrical pulse, preferably under forward bias, ruptures antifuse 14 and switches the polysilicon of the diode from a first resistivity state to a second resistivity state lower than the first, placing the memory cell in the P state, which in this example is the lowest resistivity state. A second electrical pulse, preferably under reverse bias, switches the polysilicon of the diode from the second resistivity state to a third resistivity state, the third resistivity state higher resistivity than the second, placing the memory cell in the S state. A third electrical pulse, preferably also under reverse bias, switches the polysilicon of the diode from the third resistivity state to a fourth resistivity state, the third resistivity state higher resistivity than the second, placing the memory cell in the R state. For any given memory cell, any of the data states, the V state, the R state, the S state, and the P state, can be read as a data state of the memory cell. Each transition is labeled in FIG. 6. Four distinct states are shown; there could be three or more than four states as desired.

Figure 7:
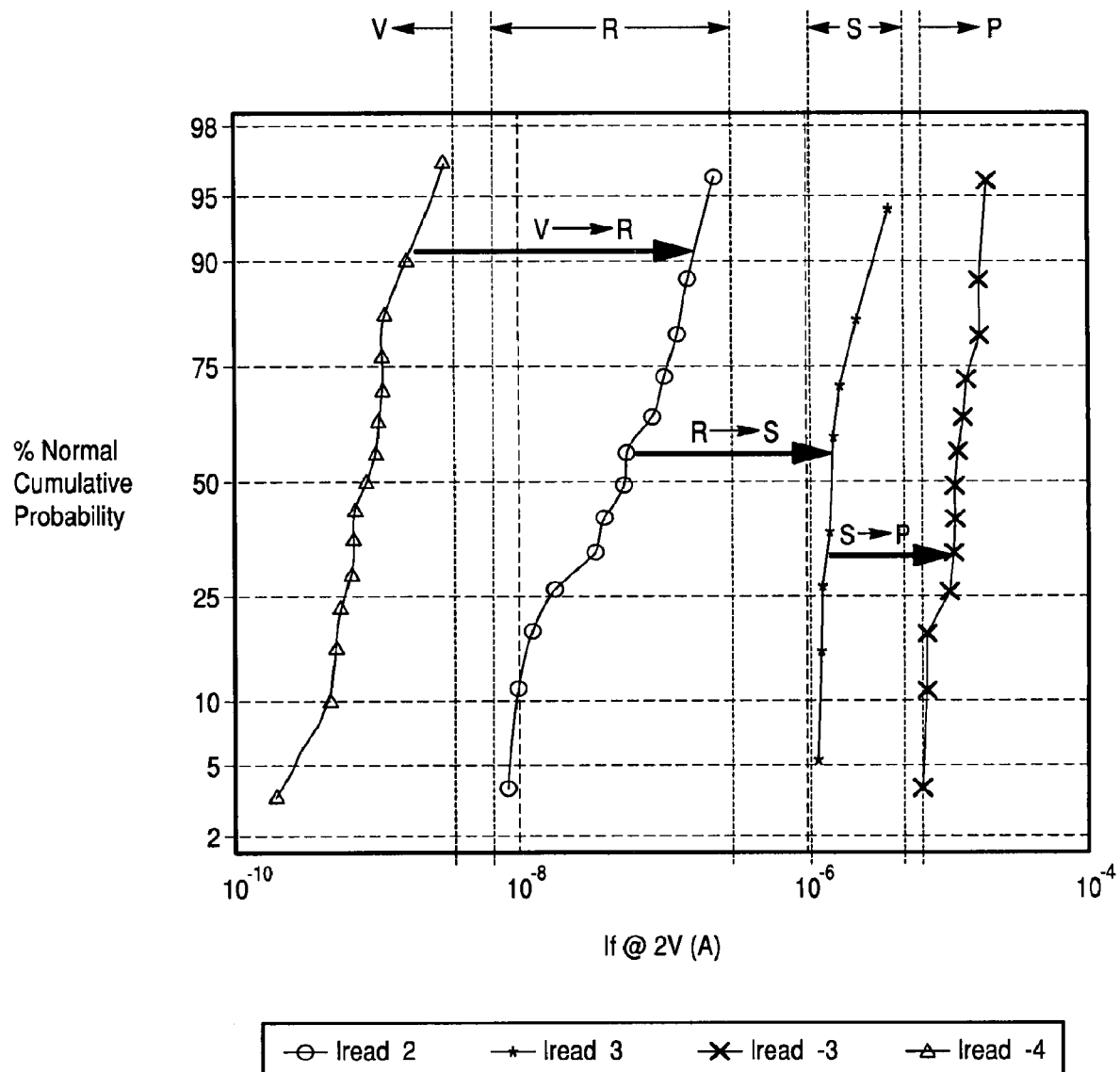
FIG. 7 is a probability plot which is plotted as Percent (%) Normal Cumulative Probability vs. Current Flow under 2V read voltage ($I_f@2V$ (A)) shown for various read current values $I_{read}$ 2, $I_{read}$ 3, $I_{read}$ –3, and $I_{read}$ –4 corresponding to the resistivity states R, S, P, and V, respectively and showing memory cells transformed from the V state to the R state, from the R state to the S state, and from the S state to the P state.

In still other embodiments, each successive electrical pulse can switch the semiconductor material of the diode to a successively lower resistivity state. As in FIG. 7, for example, the memory cell can proceed from the initial V state to the R state, from the R state to the S state, and from the S state to the P state, where for each state the read current is at least two times the read current at the previous state, each corresponding to a distinct data state. This scheme may be most advantageous when there is no antifuse included in the cell. In this example the pulses may be applied under either forward or reverse bias. In alternative embodiments there may be three data states or more than four data states.

Figure 8:
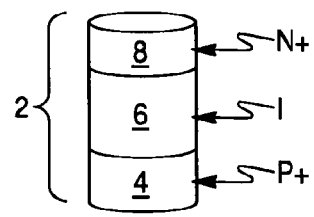
FIG. 8 is a perspective view of a vertically oriented p-i-n diode that may be used in embodiments of the present invention. Doping is indicated by the labels N+ for n-doped material, I for intrinsic or lightly doped material, and P+ for p-doped material.

In one embodiment, a memory cell includes the polysilicon or microcrystalline diode 2 shown in FIG. 8, including bottom heavily doped p-type region 4, middle intrinsic or lightly doped region 6, and top heavily doped n-type region 8. As in prior embodiments, this diode 2 can be arranged in series with a dielectric rupture antifuse, the two disposed between top and bottom conductors. Bottom heavily doped p-type region 4 may be in situ doped, i.e. doped by flowing a gas that provides a p-type dopant such as boron during deposition of the polysilicon, such that dopant atoms are incorporated into the film as it forms.

Figure 9:
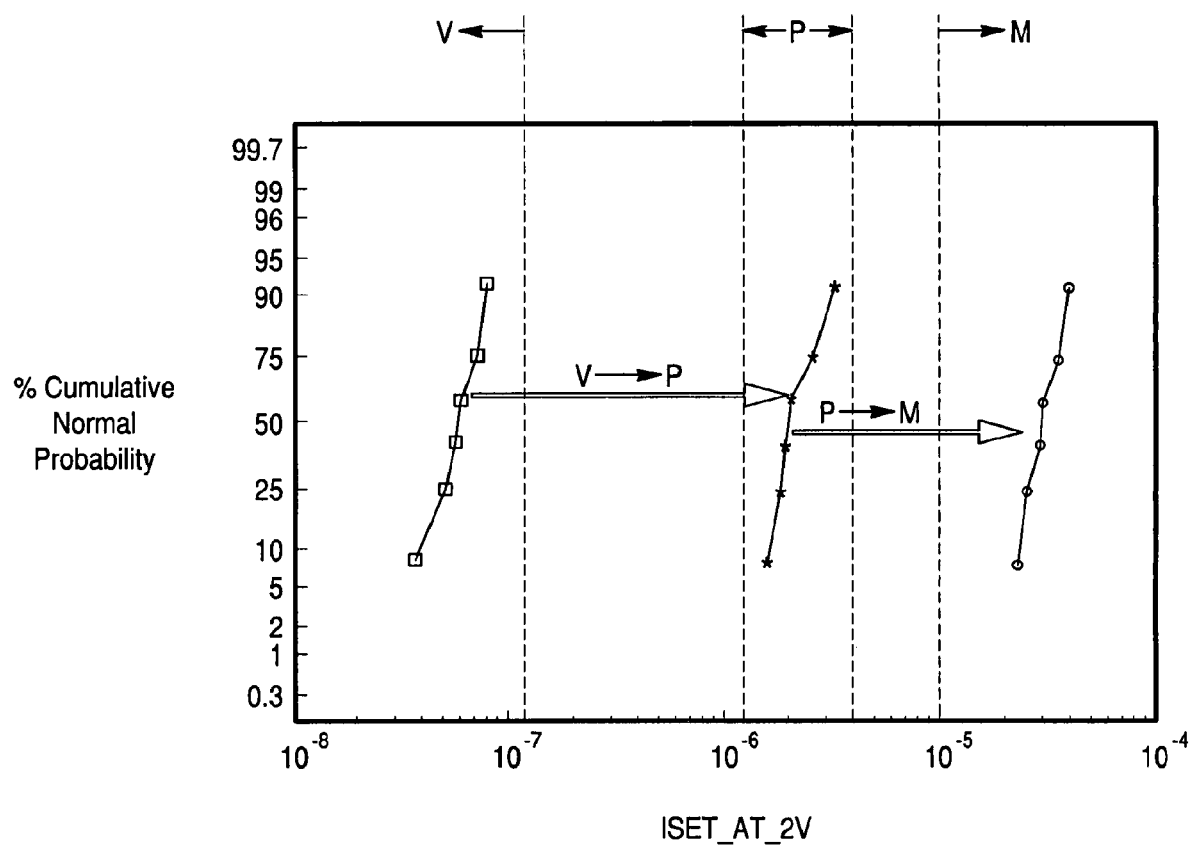
FIG. 9 is a probability plot which is plotted as Percent (%) Normal Cumulative Probability vs. Current Flow under 2V read voltage (ISET_AT_2V) showing memory cells transformed from the V state to the P state, and from the P state to the M state.

Turning to FIG. 9, it has been found that this memory cell is formed in the V state, where the current between top conductor 16 and bottom conductor 12 is less than about 80 nanoamps at a read voltage of 2 volts. A first electrical pulse, preferably applied under forward bias of, for example, about 8 volts, ruptures dielectric rupture antifuse 14, if it is present, and switches the polysilicon of diode 2 from a first resistivity state to a second resistivity state, the second resistivity state lower than the first, placing the memory cell in data state P. In data state P, the current between top conductor 16 and bottom conductor 12 at the read voltage is between about 1 microamp and about 4 microamps. A second electrical pulse, preferably applied in reverse bias, switches the polysilicon of diode 2 from the second resistivity state to a third resistivity state, the third resistivity state lower than the first. The third resistivity state corresponds to data state M. In data state M, the current between top conductor 16 and bottom conductor 12 at the read voltage is above about 10 microamps. As in prior embodiments, the difference in current between any cell in adjacent data states (the highest-current cell of state V and the lowest-current cell of state P, or between the highest-current cell of state P and the lowest-current cell of state M) is preferably at least a factor of two, preferably a factor of three or more. Any of the data states V, P, or M can be detected as a data state of the memory cell.

FIG. 4 showed that when a semiconductor diode is subjected to reverse bias, in general the semiconductor material initially undergoes a set transition to lower resistivity, then, as voltage is increased, undergoes a reset transition to higher resistivity. For this particular diode, with top heavily doped n-type region 8, and preferably with bottom heavily doped region 4 formed by in situ doping with a p-type dopant, the switch from set transition to reset transition with increasing reverse bias voltage does not occur as abruptly or as steeply as with other embodiments of the diode. This means a set transition under reverse bias is easier to control with such a diode.

Rewritable Memory Cell

In another set of embodiments, the memory cell behaves as a rewriteable memory cell, which is repeatably switchable between two or between three data states.

Figure 10:
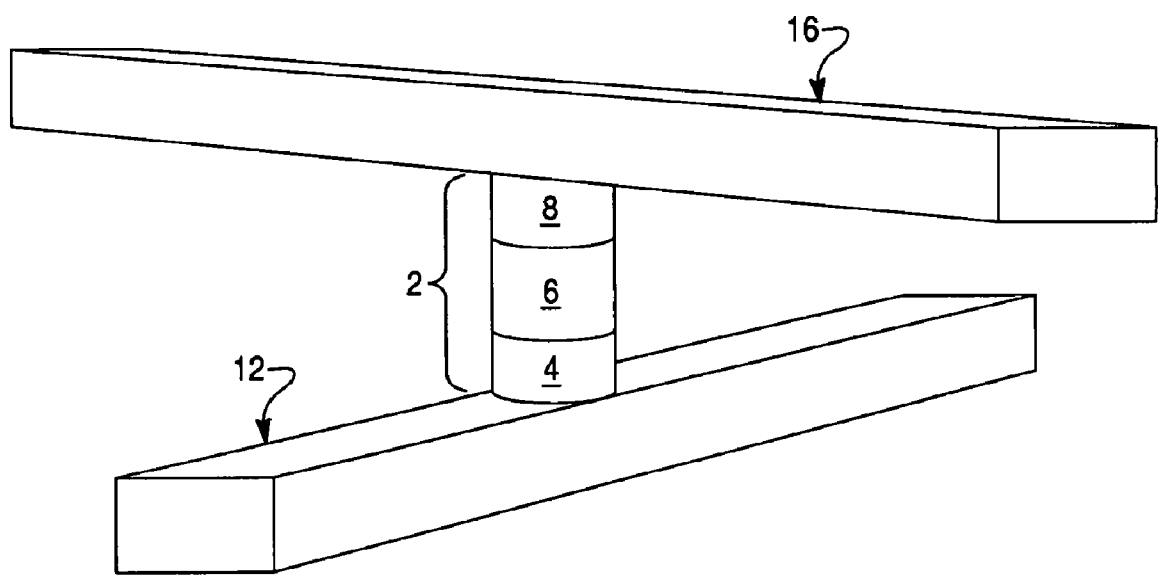
FIG. 10 is a perspective view of a multi-state or rewriteable memory cell formed according to a preferred embodiment of the present invention.

FIG. 10 shows a memory cell that may serve as a rewriteable memory cell. This memory cell is the same as the one shown in FIG. 2, except no dielectric rupture antifuse is included. Most rewriteable embodiments do not include an antifuse in the memory cell, though one may be included if desired.

Figure 11:
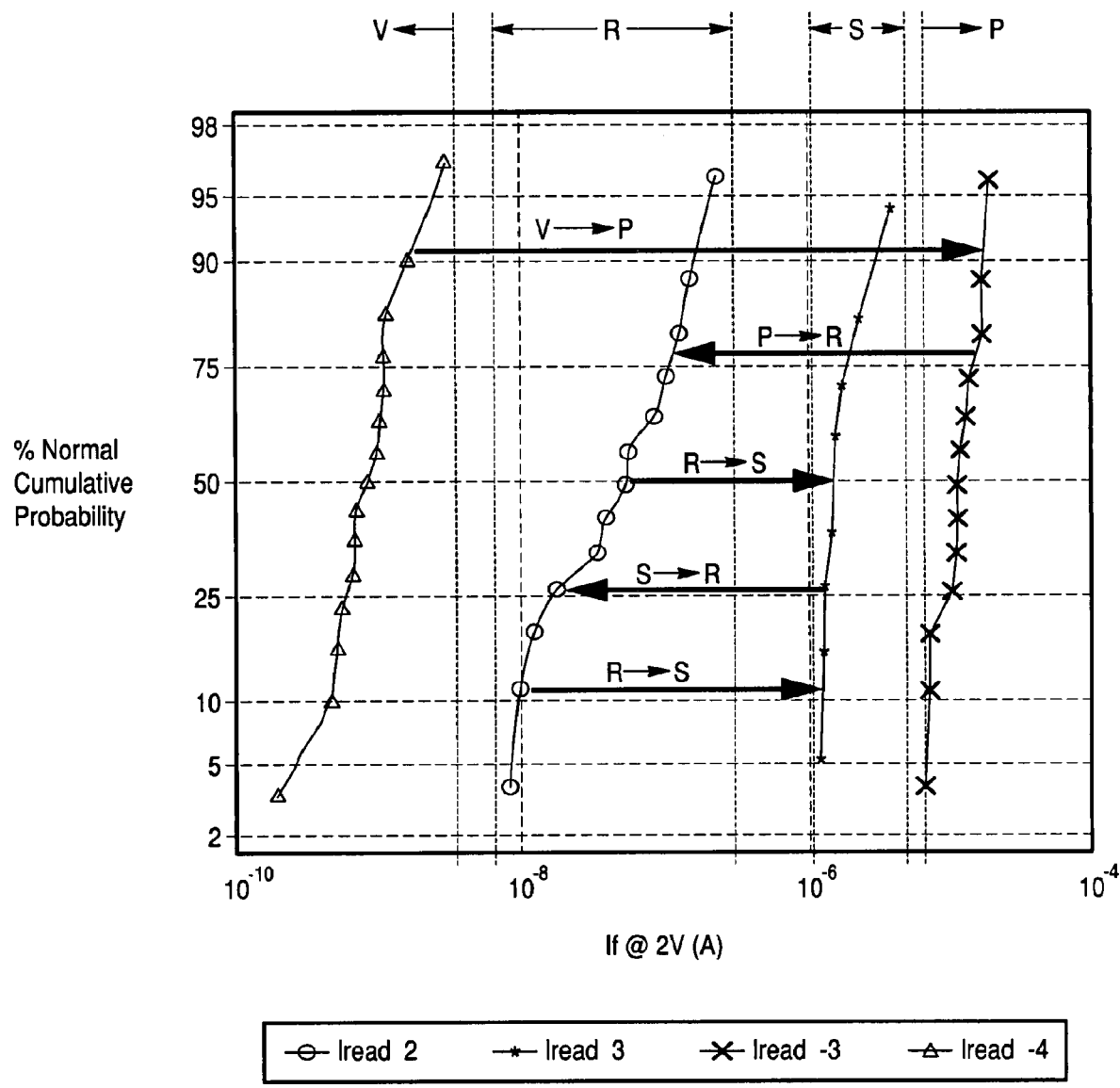
FIG. 11 is a probability plot which is plotted as Percent (%) Normal Cumulative Probability vs. Current Flow under 2V read voltage ("$I_f@2V$ (A)), shown for various read current values $I_{read}$ 2, $I_{read}$ 3, $I_{read}$ –3, and $I_{read}$ –4 corresponding to the resistivity states R, S, P, and V, respectively and showing memory cells transformed from the V state to the P state, from the P state to the R state, and from the R state to the S state, then repeatably between the S state and the R state.

Turning to FIG. 11, in a first preferred embodiment, the memory cell is formed in a high resistivity state V, with current at 2 volts about 5 nanoamps or less. For most rewriteable embodiments the initial V state does not serve as a data state of the memory cell. A first electrical pulse, preferably with diode 2 under forward bias, is applied between top conductor 16 and bottom conductor 12. This pulse is, for example, between about 8 and about 12 volts, preferably about 10 volts. This first electrical pulse switches the semiconductor material of diode 2 from a first resistivity state to a second resistivity state P, the second state lower resistivity than the first. In preferred embodiments, the P state also will not serve as a data state of the memory cell. In other embodiments, the P state will serve as a data state of the memory cell.

A second electrical pulse, preferably with diode 2 under reverse bias, is applied between top conductor 16 and bottom conductor 12. This pulse is, for example, between about −8 and about −14 volts, preferably between about −9 and about −13 volts, more preferably about −10 or −11 volts. The voltage required will vary with the thickness of the intrinsic region. This second electrical pulse switches the semiconductor material of diode 2 from the second resistivity state to a third resistivity state R, the third state higher resistivity than the second. In preferred embodiments the R state corresponds to a data state of the memory cell.

A third electrical pulse can be applied between top conductor 16 and bottom conductor 12, preferably under forward bias. This pulse is, for example, between about 5.5 and about 9 volts, preferably about 6.5 volts, with current between about 10 and about 200 microamps, preferably between about 50 and about 100 microamps. This third electrical pulse switches the semiconductor material of diode 2 from the third resistivity state R to a fourth resistivity state S, the fourth state lower resistivity than the third. In preferred embodiments the S state corresponds to a data state of the memory cell.

In this rewriteable, two-state embodiment, the R state and the S state are sensed, or read, as data states. The memory cell can repeatedly be switched between these two states. For example, a fourth electrical pulse, preferably with diode 2 under reverse bias, switches the semiconductor material of the diode from the fourth resistivity state S to the fifth resistivity state R, which is substantially the same as the third resistivity state R. A fifth electrical pulse, preferably with diode 2 under forward bias, switches the semiconductor material of the diode from the fifth resistivity state R to the sixth resistivity state S, which is substantially the same as the fourth resistivity state S, and so on. It may be more difficult to return the memory cell to the initial V state and the second P state; thus these states may not be used as data states in a rewriteable memory cell. It may be preferred for both the first electrical pulse, which switches the cell from the initial V state to the P state, and the second electrical pulse, which switches the cell from the P state to the R state, to be performed before the memory array reaches the end user, for example in a factory or test facility, or by a distributor before sale. In other embodiments, it may be preferred for only the first electric pulse, which switches the cell from the initial V state to the P state, to be performed before the memory array reaches the end user.

As will be seen from FIG. 11, in the example provided, the difference between current flow under read voltage, for example of 2 volts, between top conductor 16 and bottom conductor 12 between any cell in one data state and any cell in an adjacent data states, in this case the R data state (between about 10 and about 500 nanoamps) and the S data state (between about 1.5 and about 4.5 microamps), is at least a factor of three. Depending on the ranges selected for each data state, the difference may be a factor of two, three, five, or more.

In alternative embodiments, a rewriteable memory cell can be switched between three or more data states, in any order. Either set or reset transitions can be performed with the diode under either forward or reverse bias.

In both the one-time programmable and rewriteable embodiments described, note that the data state corresponds to the resistivity state of polycrystalline or microcrystalline semiconductor material making up a diode. The data states does not correspond to the resistivity state of a resistivity-switching metal oxide or nitride, as in Herner et al., U.S. patent application Ser. No. 11/395,995, "Nonvolatile Memory Cell Comprising a Diode and a Resistance-Switching Material," filed Mar. 31, 2006, owned by the assignee of the present invention and hereby incorporated by reference.

Reverse Bias Set and Reset

In an array of memory cells formed and programmed according to the embodiments described so far, any step in which cells are subjected to large voltages in reverse bias has reduced leakage current as compared to a forward bias step.

Figure 12:
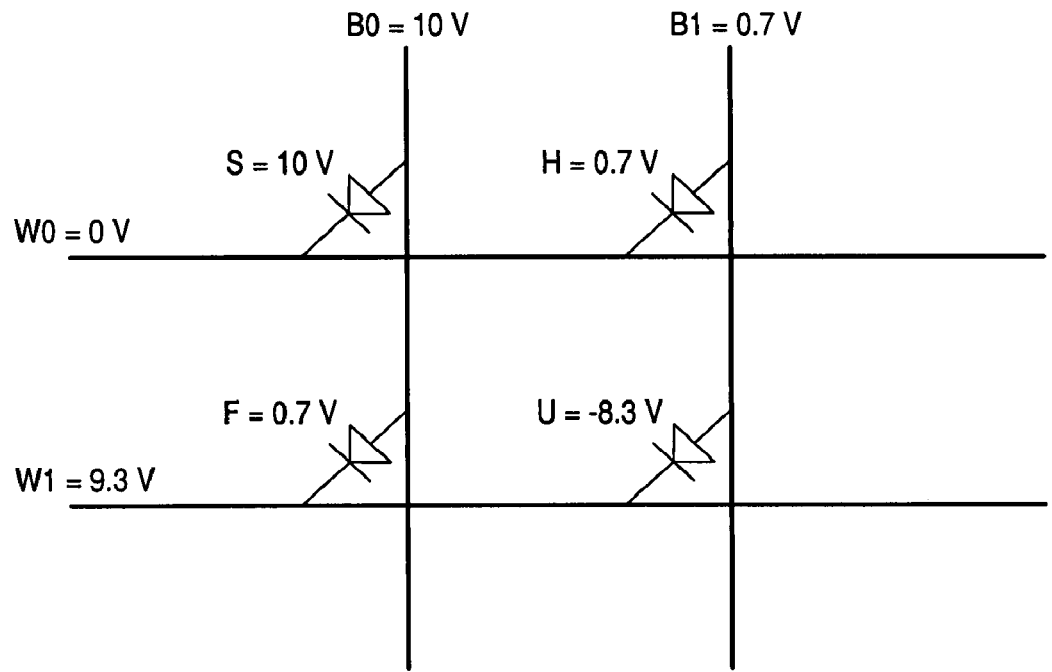
FIG. 12 is a circuit diagram showing a biasing scheme to bias the S cell in forward bias.

Turning to FIG. 12, suppose 10 volts is to be applied in forward bias across the selected cell S. (The actual voltage to be used will depend on many factors, including the construction of the cell, dopant levels, height of the intrinsic region, etc.; 10 volts is merely an example.) Bitline B0 is set at 10 volts and wordline W0 is set at ground. To assure that half-selected cells F (which share bitline B0 with selected cell S) remain below the turn-on voltage of the diode, wordline W1 is set less than but relatively close to the voltage of bitline B0; for example wordline W1 may be set to 9.3 volts, so that 0.7 volts is applied across the F cells (only one F cell is shown, but there may be hundreds, thousands or more.) Similarly, to assure that half-selected cells H (which share wordline W0 with selected cell S) remain below the turn-on voltage of the diode, bitline B1 is set higher than but relatively close to the voltage of wordline W0; for example bitline B1 may be set to 0.7 volts, so that 0.7 volts is applied across cell H (again, there may be thousands of H cells.) The unselected cells U, which share neither wordline W0 or bitline B0 with selected cell S, are subjected to −8.6 volts. As there may be millions of unselected cells U, this results in significant leakage current within the array.

Figure 13:
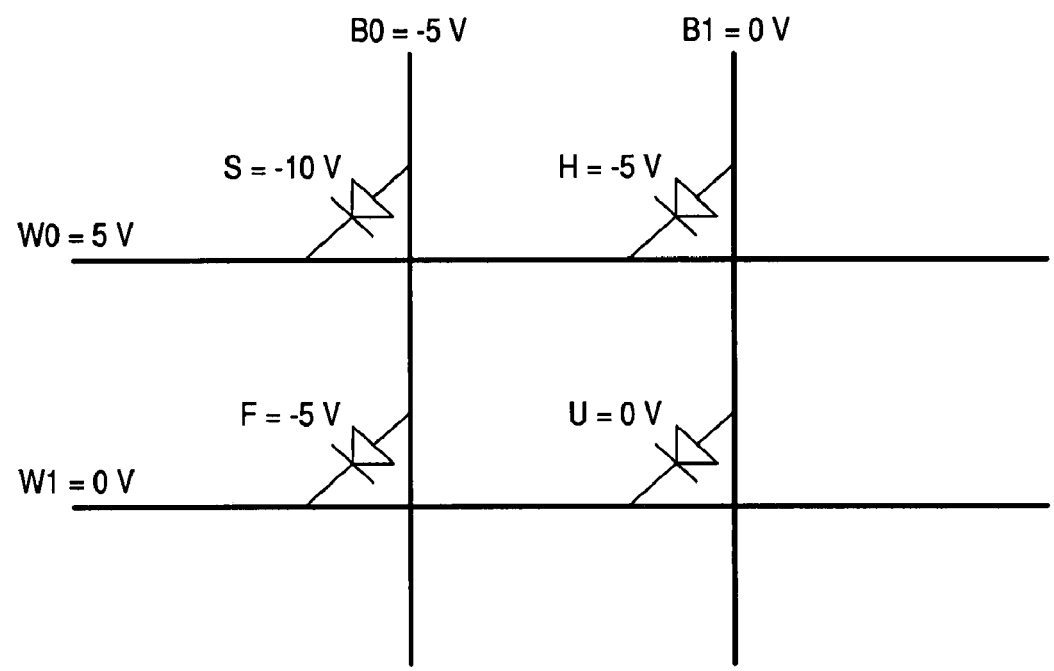
FIG. 13 is a circuit diagram showing one biasing scheme to bias the S cell in reverse bias.

FIG. 13 shows an advantageous biasing scheme to apply a large reverse bias across a memory cell, for example as a reset pulse. Bitline B0 is set at −5 volts and wordline W0 at 5 volts, so that −10 volts is applied across selected cell S; the diode is in reverse bias. Setting wordline W1 and bitline B1 at ground subjects both half-selected cells F and H to −5 volts, at a reverse bias low enough not to cause unintentional set or reset of these cells. Set or reset in reverse bias generally seems to take place at or near the voltage at which the diode goes into reverse breakdown, which is generally higher than −5 volts.

With this scheme, there is no voltage across the unselected cells U, resulting in no reverse leakage. As a result, bandwidth can be increased significantly.

The biasing scheme of FIG. 13 is just one example; clearly many other schemes can be used. For example bitline B0 can be set at 0 volts, wordline W0 at −10 volts, and bitline B1 and wordline W1 at −5 volts. The voltage across selected cell S, half-selected cells H and F, and unselected cells U will be the same as in the scheme of FIG. 13. In another example, bitline B0 is set at ground, wordline W0 at 10 volts, and bitline B1 and wordline W1 each at 5 volts.

Iterative Set and Reset

So far this discussion has described applying an appropriate electrical pulse to switch the semiconductor material of a diode from one resistivity state to a different resistivity state, thus switching the memory cell between two distinct data states. In practice, these set and reset steps may be iterative processes.

As described, the difference between current flow during read in adjacent data states is preferably at least a factor of two; in many embodiments, it may be preferred to establish current ranges for each data state which are separated by a factor of three, five, ten, or more.

Figure 14:
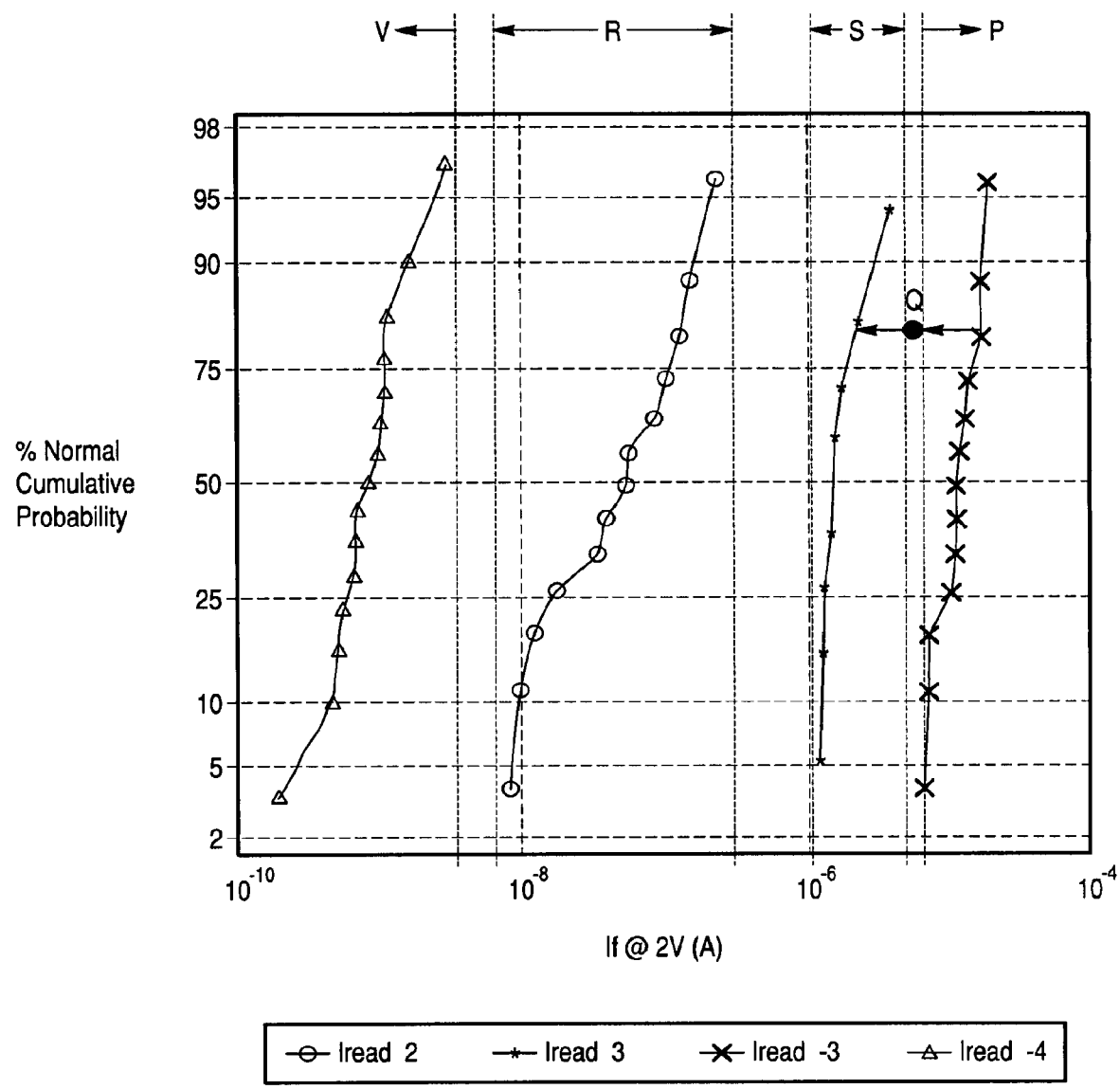
FIG. 14 is a probability plot which is plotted as Percent (%) Normal Cumulative Probability vs. Current Flow under 2V read voltage ("$I_f@2V$ (A)) which illustrates iterative read-verify-write cycles to move a cell into a data state.

Turning to FIG. 14, as described, data state V may be defined as read current of 5 nanoamps or less at a read voltage of 2 volts, data state R as read current between about 10 and about 500 nanoamps, data state S as read current between about 1.5 and about 4.5 microamps, and data state P as read current above about 10 microamps. Those skilled in the art will appreciate that these are examples only. In another embodiment, for example, data state V may be defined in a smaller range, with read current about 5 nanoamps or less at a read voltage of 2 volts. Actual read currents will vary with characteristics of the cell, construction of the array, read voltage selected, and many other factors.

Suppose a one-time programmable memory cell is in data state P. An electrical pulse in reverse bias is applied to the memory cell to switch the cell into data state S. In some instances, however, it may be that after application of the electrical pulse, the read current is not in the desired range; i.e. the resistivity state of the semiconductor material of the diode is higher or lower than intended. For example, suppose after application of the electrical pulse, the read current of the memory cell is at the point on the graph shown at Q, in between the S state and P state current ranges.

After an electrical pulse is applied to switch the memory cell to a desired data state, the memory cell may be read to determine if the desired data state was reached. If the desired data state was not reached, an additional pulse is applied. For example, when the current Q is sensed, an additional reset pulse is applied to increase the resistivity of the semiconductor material, decreasing the read current into the range corresponding to the S data state. As described earlier, this set pulse may be applied in either forward or reverse bias. The additional pulse or pulses may have a higher amplitude (voltage or current) or longer or shorter pulse width than the original pulse. After the additional set pulse, the cell is read again, then set or reset pulses applied as appropriate until the read current is in the desired range.

FIG. 14 shows that state Q is reached during the reverse bias voltage application in a transition from state P to state S (i.e., during the application of a reset voltage). However, state Q may be reached during application of a forward bias (i.e., during the application of a set voltage). For example, the intermediate state Q may be reached during the application of the initial programming voltage where the diode transitions from state V to state P. In that case, as described above, multiple forward bias programming pulses are applied to the diode to reach the programmed state P from the initial unprogrammed state V.

In a two-terminal device, such as the memory cell including a diode described, it will be particularly advantageous to read in order to verify the set or reset and to adjust if necessary. Applying a large reverse bias across the diode may damage the diode; thus when performing a set or reset with the diode under reverse bias, it is advantageous to minimize the reverse bias voltage.

Fabrication Considerations

Herner et al., U.S. patent application Ser. No. 11/148,530, "Nonvolatile Memory Cell Operating by Increasing Order in Polycrystalline Semiconductor Material," filed Jun. 8, 2006; and Herner, U.S. patent application Ser. No. 10/954,510, "Memory Cell Comprising a Semiconductor Junction Diode Crystallized Adjacent to a Silicide," filed Sep. 29, 2004, both owned by the assignee of the present invention and both hereby incorporated by reference, describe that crystallization of polysilicon adjacent to an appropriate silicide affects the properties of the polysilicon. Certain metal silicides, such as cobalt silicide and titanium silicide, have a lattice structure very close to that of silicon. When amorphous or microcrystalline silicon is crystallized in contact with one of these silicides, the crystal lattice of the silicide provides a template to the silicon during crystallization. The resulting polysilicon will be highly ordered, and relatively low in defects. This high-quality polysilicon, when doped with a conductivity-enhancing dopant, is relatively highly conductive as formed.

When, in contrast, an amorphous or microcrystalline silicon material is crystallized not in contact with a silicon having a silicide with which it has a good lattice match, for example in contact only with materials such as silicon dioxide and titanium nitride, with which it has a significant lattice mismatch, the resulting polysilicon will have many more defects, and doped polysilicon crystallized this way will be much less conductive as formed.

In aspects of the present invention, the semiconductor material forming a diode is switched between two or more resistivity states, changing the current flowing through the diode at a given read voltage, the different currents (and resistivity states) corresponding to distinct data states. It has been found that diodes formed of high-defect silicon (or other appropriate semiconductor materials such as germanium or silicon-germanium alloys) which has not been crystallized adjacent to a silicide or analogous material providing a crystallization template exhibit the most advantageous switching behavior.

Without wishing to be bound by any particular theory, it is believed that one possible mechanism behind the observed changes in resistivity is that set pulses above the threshold amplitude cause dopant atoms to move out of grain boundaries, where they are inactive, into the body of a crystal where they will increase conductivity and lower the resistance of the semiconductor material. In contrast, reset pulses may cause dopant atoms to move back to the grain boundaries, lowering conductivity and increasing resistance. It may be, however, that other mechanisms, such as an increase and decrease in degree of order of the polycrystalline material, are operating as well or instead.

It has been found that the resistivity state of very low-defect silicon crystallized adjacent to an appropriate silicide cannot be switched as readily as when the semiconductor material has a higher level of defects. It may be that the presence of defects, or of a larger number of grain boundaries, allows for easier switching. In preferred embodiments, then, the polycrystalline or microcrystalline material forming the diode is not crystallized adjacent to a material with which it has a small lattice mismatch. A small lattice mismatch is, for example, a lattice mismatch of about three percent or less.

Evidence has suggested that switching behavior may be centered on changes in the intrinsic region. Switching behavior has been observed in resistors and p-n diodes as well, and is not limited to p-i-n diodes, but it is believed that the use of p-i-n diodes may be particularly advantageous. The embodiments described so far included a p-i-n diode. In other embodiments, however, the diode may be a p-n diode instead, with little or no intrinsic region.

A detailed example will be provided describing fabrication of a preferred embodiment of the present invention. Fabrication details from Herner et al., U.S. patent application Ser. No. 10/320,470, "An Improved Method for Making High Density Nonvolatile Memory," filed Dec. 19, 2002, and since abandoned, hereby incorporated by reference, will be useful in formation of the diode of these embodiments, as will information from the '549 application. Useful information may also be derived from Herner et al., U.S. patent application Ser. No. 11/015,824, "Nonvolatile Memory Cell Comprising a Reduced Height Vertical Diode," filed Dec. 17, 2004, assigned to the assignee of the present invention and hereby incorporated by reference. To avoid obscuring the invention not all of the detail from these applications will be included, but it will be understood that no information from these applications is intended to be excluded.

EXAMPLE

Fabrication of a single memory level will be described in detail. Additional memory levels can be stacked, each monolithically formed above the one below it. In this embodiment, a polycrystalline semiconductor diode will serve as the switchable memory element.

Figure 15A:
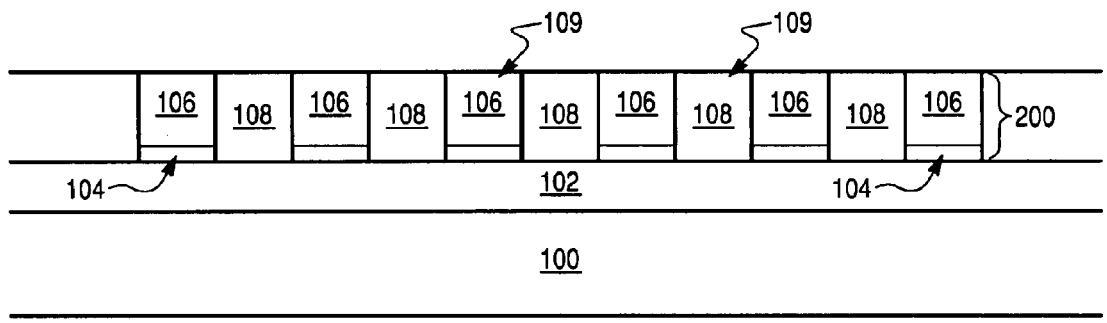
FIGS. 15a-15c are cross-sectional views illustrating stages in formation of a memory level formed according to an embodiment of the present invention.

Turning to FIG. 15a, formation of the memory begins with a substrate 100. This substrate 100 can be any semiconducting substrate as known in the art, such as monocrystalline silicon, IV-IV compounds like silicon-germanium or silicon-germanium-carbon, III-V compounds, II-VII compounds, epitaxial layers over such substrates, or any other semiconducting material. The substrate may include integrated circuits fabricated therein.

An insulating layer 102 is formed over substrate 100. The insulating layer 102 can be silicon oxide, silicon nitride, high-dielectric film, Si—C—O—H film, or any other suitable insulating material.

The first conductors 200 are formed over the substrate and insulator. An adhesion layer 104 may be included between the insulating layer 102 and the conducting layer 106 to help conducting layer 106 adhere to insulating layer 102. If the overlying conducting layer is tungsten, titanium nitride is preferred as adhesion layer 104.

The next layer to be deposited is conducting layer 106. Conducting layer 106 can comprise any conducting material known in the art, such as tungsten, or other materials, including tantalum, titanium, copper, cobalt, or alloys thereof.

Once all the layers that will form the conductor rails have been deposited, the layers will be patterned and etched using any suitable masking and etching process to form substantially parallel, substantially coplanar conductors 200, shown in FIG. 15a in cross-section. In one embodiment, photoresist is deposited, patterned by photolithography and the layers etched, and then the photoresist removed using standard process techniques. Conductors 200 could be formed by a Damascene method instead.

Next a dielectric material 108 is deposited over and between conductor rails 200. Dielectric material 108 can be any known electrically insulating material, such as silicon oxide, silicon nitride, or silicon oxynitride. In a preferred embodiment, silicon dioxide is used as dielectric material 108.

Finally, excess dielectric material 108 on top of conductor rails 200 is removed, exposing the tops of conductor rails 200 separated by dielectric material 108, and leaving a substantially planar surface 109. The resulting structure is shown in FIG. 15a. This removal of dielectric overfill to form planar surface 109 can be performed by any process known in the art, such as chemical mechanical planarization (CMP) or etchback. An etchback technique that may advantageously be used is described in Raghuram et al., U.S. application Ser. No. 10/883,417, "Nonselective Unpatterned Etchback to Expose Buried Patterned Features," filed Jun. 30, 2004 and hereby incorporated by reference. At this stage, a plurality of substantially parallel first conductors have been formed at a first height above substrate 100.

Figure 15B:
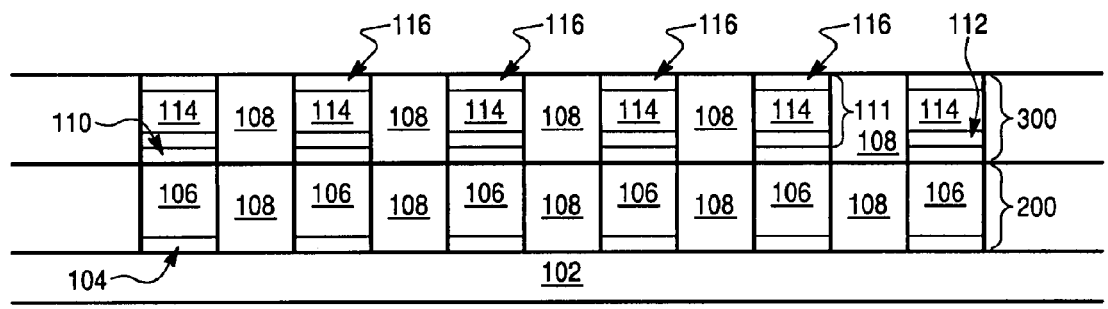

Next, turning to FIG. 15b, vertical pillars will be formed above completed conductor rails 200. (To save space substrate 100 is not shown in FIG. 15b; its presence will be assumed.) Preferably a barrier layer 110 is deposited as the first layer after planarization of the conductor rails. Any suitable material can be used in the barrier layer, including tungsten nitride, tantalum nitride, titanium nitride, or combinations of these materials. In a preferred embodiment, titanium nitride is used as the barrier layer. Where the barrier layer is titanium nitride, it can be deposited in the same manner as the adhesion layer described earlier.

Next semiconductor material that will be patterned into pillars is deposited. The semiconductor material can be silicon, germanium, a silicon-germanium alloy, or other suitable semiconductors, or semiconductor alloys. For simplicity, this description will refer to the semiconductor material as silicon, but it will be understood that the skilled practitioner may select any of these other suitable materials instead.

In preferred embodiments, the pillar comprises a semiconductor junction diode. The term junction diode is used herein to refer to a semiconductor device with the property of non-ohmic conduction, having two terminal electrodes, and made of semiconducting material which is p-type at one electrode and n-type at the other. Examples include p-n diodes and n-p diodes, which have p-type semiconductor material and n-type semiconductor material in contact, such as Zener diodes, and p-i-n diodes, in which intrinsic (undoped) semiconductor material is interposed between p-type semiconductor material and n-type semiconductor material.

Bottom heavily doped region 112 can be formed by any deposition and doping method known in the art. The silicon can be deposited and then doped, but is preferably doped in situ by flowing a donor gas providing n-type dopant atoms, for example phosphorus, during deposition of the silicon. Heavily doped region 112 is preferably between about 100 and about 800 angstroms thick.

Intrinsic layer 114 can be formed by any method known in the art. Layer 114 can be silicon, germanium, or any alloy of silicon or germanium and has a thickness between about 1100 and about 3300 angstroms, preferably about 2000 angstroms.

Returning to FIG. 15b, semiconductor layers 114 and 112 just deposited, along with underlying barrier layer 110, will be patterned and etched to form pillars 300. Pillars 300 should have about the same pitch and about the same width as conductors 200 below, such that each pillar 300 is formed on top of a conductor 200. Some misalignment can be tolerated.

The pillars 300 can be formed using any suitable masking and etching process. For example, photoresist can be deposited, patterned using standard photolithography techniques, and etched, then the photoresist removed. Alternatively, a hard mask of some other material, for example silicon dioxide, can be formed on top of the semiconductor layer stack, with bottom antireflective coating (BARC) on top, then patterned and etched. Similarly, dielectric antireflective coating (DARC) can be used as a hard mask.

The photolithography techniques described in Chen, U.S. application Ser. No. 10/728,436, "Photomask Features with Interior Nonprinting Window Using Alternating Phase Shifting," filed Dec. 5, 2003; or Chen, U.S. application Ser. No. 10/815,312, Photomask Features with Chromeless Nonprinting Phase Shifting Window," filed Apr. 1, 2004, both owned by the assignee of the present invention and hereby incorporated by reference, can advantageously be used to perform any photolithography step used in formation of a memory array according to the present invention.

Dielectric material 108 is deposited over and between the semiconductor pillars 300, filling the gaps between them. Dielectric material 108 can be any known electrically insulating material, such as silicon oxide, silicon nitride, or silicon oxynitride. In a preferred embodiment, silicon dioxide is used as the insulating material.

Next the dielectric material on top of the pillars 300 is removed, exposing the tops of pillars 300 separated by dielectric material 108, and leaving a substantially planar surface. This removal of dielectric overfill can be performed by any process known in the art, such as CMP or etchback. After CMP or etchback, ion implantation is performed, forming heavily doped p-type top region 116. The p-type dopant is preferably boron or $BCl_3$. This implant step completes formation of diodes 111. The resulting structure is shown in FIG. 15b. In the diodes just formed, bottom heavily doped regions 112 are n-type while top heavily doped regions 116 are p-type; clearly the polarity could be reversed.

Figure 15C:
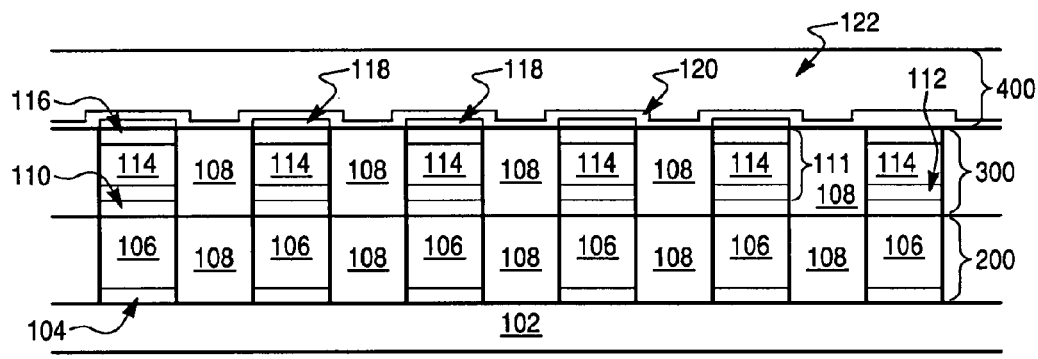

Turning to FIG. 15c, next the option dielectric rupture antifuse layer 118 is formed on top of each heavily doped region 116. Antifuse 118 is preferably a silicon dioxide layer formed by oxidizing the underlying silicon in a rapid thermal anneal, for example at about 600 degrees. Antifuse 118 may be about 20 angstroms thick. Alternatively, antifuse 118 can be deposited. If desired, the antifuse 118 may be omitted.

Top conductors 400 can be formed in the same manner as bottom conductors 200, for example by depositing adhesion layer 120, preferably of titanium nitride, and conductive layer 122, preferably of tungsten. Conductive layer 122 and adhesion layer 120 are then patterned and etched using any suitable masking and etching technique to form substantially parallel, substantially coplanar conductors 400, shown in FIG. 15c extending left-to-right across the page. In a preferred embodiment, photoresist is deposited, patterned by photolithography and the layers etched, and then the photoresist removed using standard process techniques.

Next a dielectric material (not shown) is deposited over and between conductor rails 400. The dielectric material can be any known electrically insulating material, such as silicon oxide, silicon nitride, or silicon oxynitride. In a preferred embodiment, silicon oxide is used as this dielectric material.

Formation of a first memory level has been described. Additional memory levels can be formed above this first memory level to form a monolithic three dimensional memory array. In some embodiments, conductors can be shared between memory levels; i.e. top conductor 400 would serve as the bottom conductor of the next memory level. In other embodiments, an interlevel dielectric (not shown) is formed above the first memory level of FIG. 15c, its surface planarized, and construction of a second memory level begins on this planarized interlevel dielectric, with no shared conductors.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

A monolithic three dimensional memory array formed above a substrate comprises at least a first memory level formed at a first height above the substrate and a second memory level formed at a second height different from the first height. Three, four, eight, or indeed any number of memory levels can be formed above the substrate in such a multilevel array.

An alternative method for forming a similar array in which conductors are formed using Damascene construction is described in Radigan et al., U.S. patent application Ser. No. 11/444,936, "Conductive Hard Mask to Protect Patterned Features During Trench Etch," filed May 31, 2006, assigned to the assignee of the present invention and hereby incorporated by reference. The methods of Radigan et al. may be used instead to form an array according to the present invention.

ALTERNATIVE EMBODIMENTS

In addition to those already described, many alternative embodiments of a memory cell having its data state stored in the resistivity state of polycrystalline or microcrystalline semiconductor material are possible and fall within the scope of the invention. A few other possible embodiments will be mentioned, but this list cannot and is not intended to be exhaustive.

Figure 16:
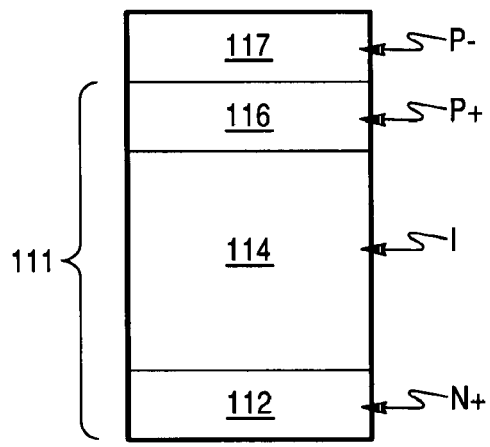
FIG. 16 is cross-sectional view illustrating a diode and resistive switching element that may be used an alternative embodiment of the present invention. Doping is indicated by the labels N+ for n-doped material, I for intrinsic or lightly doped material, P+ for p-doped material, and P− for resistance switchable material.

FIG. 16 shows a switchable memory element 117 formed in series with a diode 111. The switchable memory element 117 is formed of semiconductor material which is switched between resistivity states using electrical pulses as described. The diode is preferably crystallized adjacent to a silicide such as cobalt silicide, which provides a crystallization template, as described earlier, such that the semiconductor material of the diode is very low-defect and exhibits little or no switching behavior. Switchable memory element 117 is preferably doped, and should be doped to the same conductivity type as top heavily doped region 116. Methods to fabricate this device are described in the '167 application.

Detailed methods of fabrication have been described herein, but any other methods that form the same structures can be used while the results fall within the scope of the invention.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A method of operating a nonvolatile memory cell, comprising:

providing the nonvolatile memory cell comprising a diode, said diode comprising which is fabricated in a first resistivity, unprogrammed state, wherein the resistivity state of the diode semiconductor material corresponds to a memory state of the memory cell; and applying a forward bias to the diode having a magnitude greater than a minimum voltage required for programming the diode to switch the diode to a second resistivity, programmed state, wherein the second resistivity state is lower than the first resistivity state;

wherein the first and the second resistivity states are stable resistivity states of the diode, and wherein:
the diode comprises a polycrystalline semiconductor diode; and
the step of applying the forward bias comprises applying the forward bias to the semiconductor diode to cause at least one of a change in a degree of order in a polycrystalline semiconductor material of the diode or diffusion of dopant atoms out of grain boundaries into a crystal of the polycrystalline semiconductor material of the diode.

2. The method of claim 1, wherein the step of applying the forward bias comprising applying the forward bias of at least 5 volts.

3. The method of claim 2, wherein the step of applying the forward bias comprising applying the forward bias of at about 8 to about 12 volts.

4. The method of claim 1, further comprising sensing a resistivity state of the diode as a data state of the memory cell.

5. The method of claim 4, wherein the step of sensing comprises sensing a read current of at least $3.5 \times 10^{-5}$ A at a read voltage of at least +1.5V.

6. The method of claim 1, further comprising:
applying a reverse bias to the diode to switch the diode to a third resistivity, unprogrammed state, wherein the third resistivity state is higher than the second resistivity state; and applying a forward bias to the diode to switch the diode to a fourth resistivity, programmed state, wherein the fourth resistivity state is lower than the third resistivity state.

7. The method of claim 6, wherein:
the step of applying the forward bias comprises applying the forward bias in a factory in which the memory cell is fabricated, wherein the forward bias is generated using power from the factory; and
the step of applying the reverse bias is performed by a user of the memory cell after the memory cell leaves the factory in which the memory cell is fabricated.

8. The method of claim 1, wherein the nonvolatile memory cell consists essentially of the diode and first and second electrically conductive electrodes electrically contacting the diode.

9. The method of claim 1, wherein:
the nonvolatile memory cell consists essentially of first and second electrically conductive electrodes, the diode and an antifuse;
the diode and the antifuse are located in series between the first and the second electrically conductive electrodes; and
the step of applying the forward bias comprises applying the forward bias of at least 8 volts between the first and the second electrically conductive electrodes to rupture a dielectric layer of the antifuse.

10. The method of claim 1, wherein the diode comprises a polycrystalline semiconductor p-i-n diode.

11. A method of operating a nonvolatile memory cell, comprising:
providing the nonvolatile memory cell comprising a diode which is fabricated in a first resistivity, unprogrammed state wherein the resistivity state of the diode corresponds to a memory state of the memory cell; and
applying a plurality of forward bias pulses to the diode to switch the diode to a second resistivity, programmed state, wherein the second resistivity state is lower than the first resistivity state;
wherein the first and the second resistivity states are stable resistivity states of the diode, and
wherein:
the diode comprises a polycrystalline semiconductor diode; and
the step of applying the forward bias pulses comprises applying the forward bias pulses to the semiconductor diode to cause at least one of a change in a degree of order in a polycrystalline semiconductor material of the diode or diffusion of dopant atoms out of grain boundaries into a crystal of the polycrystalline semiconductor material of the diode.

12. The method of claim 11, further comprising sensing a resistivity state of the diode as a data state of the memory cell.

13. The method of claim 12, wherein the step of sensing comprises sensing a read current of at least $3.5 \times 10^{-5}$ A at a read voltage of at least +1.5V.

14. The method of claim 11, further comprising applying a reverse bias to the diode to switch the diode to a third resistivity, unprogrammed state, wherein the third resistivity state is higher than the second resistivity state.

15. The method of claim 14, further comprising applying a forward bias to the diode to switch the diode to a fourth resistivity, programmed state, wherein the fourth resistivity state is lower than the third resistivity state.

16. The method of claim 14, wherein:
the step of applying the plurality of forward bias pulses comprises applying the forward bias pulses in a factory in which the memory cell is fabricated, wherein the forward bias pulses are generated using power from the factory; and
the step of applying the reverse bias is performed after the memory cell leaves the factory in which the memory cell is fabricated.

17. The method of claim 11, wherein the nonvolatile memory cell consists essentially of the diode and first and second electrically conductive electrodes electrically contacting the diode.

18. The method of claim 11, wherein:
the nonvolatile memory cell consists essentially of first and second electrically conductive electrodes, the diode and an antifuse;
the diode and the antifuse are located in series between the first and the second electrically conductive electrodes; and
the step of applying a plurality of forward bias pulses to the diode comprises applying the forward bias pulses between the first and the second electrically conductive electrodes to rupture a dielectric layer of the antifuse.

19. The method of claim 11, wherein the diode comprises a polycrystalline semiconductor p-i-n diode.

20. The method of claim 11, wherein the step of applying a plurality of forward bias pulses comprises applying a plurality of forward bias pulses of at least 5V.

21. The method of claim 1, wherein the step of applying the forward bias comprises applying the forward bias of at least double the minimum voltage required for programming the diode to switch the diode to a second resistivity, programmed state.

* * * * *